(12) United States Patent
Flores et al.

(10) Patent No.: US 9,831,905 B1
(45) Date of Patent: Nov. 28, 2017

(54) CONTROL FEATURE OF A PROTECTIVE CASE FOR ENGAGING A SWITCH OF AN ELECTRONIC DEVICE

(71) Applicant: Pelican Products, Inc., Torrance, CA (US)

(72) Inventors: Jesse Flores, Moreno Valley, CA (US); Jianzhi Chen, Rosemead, CA (US)

(73) Assignee: Pelican Products, Inc., Torrance, CA (US)

( * ) Notice: Subject to any disclaimer, the term of this patent is extended or adjusted under 35 U.S.C. 154(b) by 0 days.

(21) Appl. No.: 15/291,550

(22) Filed: Oct. 12, 2016

(51) Int. Cl.
*H04B 1/3888* (2015.01)
*H05K 5/00* (2006.01)

(52) U.S. Cl.
CPC ......... *H04B 1/3888* (2013.01); *H05K 5/0004* (2013.01)

(58) Field of Classification Search
CPC ............... H04B 1/3888; H04B 1/3877; A45C 2011/002; A45C 2011/003; A45C 2011/001; A45C 13/002; A45C 13/008; H05K 5/03; H05K 5/069; H05K 5/00
See application file for complete search history.

(56) References Cited

U.S. PATENT DOCUMENTS

| 3,019,715 | A | 2/1962 | Arnold et al. |
| 3,205,409 | A | 9/1965 | Owerko |
| 4,584,718 | A | 4/1986 | Fuller |
| 4,663,879 | A | 5/1987 | Bergeron, Jr. |
| 4,682,363 | A | 7/1987 | Goldfarb et al. |
| 4,733,776 | A | 3/1988 | Ward |
| 4,823,397 | A | 4/1989 | Hewitt |
| 4,836,256 | A | 6/1989 | Meliconi |
| 5,025,921 | A | 6/1991 | Gasparaitis et al. |

(Continued)

FOREIGN PATENT DOCUMENTS

| CN | 201790151 | 4/2011 |
| CN | 202476716 | 10/2012 |

(Continued)

OTHER PUBLICATIONS

US 7,535,779, 05/2009, Polany et al. (withdrawn)

(Continued)

*Primary Examiner* — Devan Sandiford
(74) *Attorney, Agent, or Firm* — Foley & Lardner LLP

(57) ABSTRACT

According to various embodiments, there is provided a case for an electronic device. The case includes a cover having a peripheral wall defining an interior for receiving at least a portion of the electronic device, the cover having a protrusion extending in a length dimension. The case further includes a control feature extending through the peripheral wall of the cover. The control feature has a first body portion configured to engage a switch of the electronic device, when the electronic device is received in the interior of the cover. The control feature further has a second body portion accessible from outside of the interior of the cover. The control feature further has a central body portion between the first body portion and the second body portion, the central body portion having a channel in which the protrusion is received, wherein the control feature is moveable along the length dimension of the protrusion, relative to the cover.

20 Claims, 20 Drawing Sheets

(56) References Cited

U.S. PATENT DOCUMENTS

| | | |
|---|---|---|
| 5,128,829 A | 7/1992 | Loew |
| 5,175,873 A | 12/1992 | Goldenberg et al. |
| 5,239,324 A | 8/1993 | Ohmura et al. |
| 5,325,139 A | 6/1994 | Matsumoto |
| 5,388,692 A | 2/1995 | Withrow et al. |
| 5,555,157 A | 9/1996 | Moller et al. |
| 5,568,358 A | 10/1996 | Nelson et al. |
| 5,648,757 A | 7/1997 | Vernace et al. |
| 5,733,023 A | 3/1998 | Lee |
| 5,737,183 A | 4/1998 | Kobayashi et al. |
| 5,812,188 A | 9/1998 | Adair |
| 5,850,915 A | 12/1998 | Tajima |
| 5,956,656 A | 9/1999 | Yamazaki |
| 6,031,524 A | 2/2000 | Kunert |
| 6,068,119 A | 5/2000 | Derr et al. |
| 6,201,867 B1 | 3/2001 | Koike |
| 6,239,968 B1 | 5/2001 | Kim et al. |
| 6,266,240 B1 | 7/2001 | Urban et al. |
| 6,349,824 B1 | 2/2002 | Yamada |
| 6,356,442 B1 | 3/2002 | Lunsford |
| 6,396,769 B1 | 5/2002 | Polany |
| 6,415,138 B2 | 7/2002 | Sirola et al. |
| 6,434,403 B1 | 8/2002 | Ausems et al. |
| 6,456,487 B1 | 9/2002 | Hetterick |
| 6,469,752 B1 | 10/2002 | Ishikawa et al. |
| 6,471,056 B1 | 10/2002 | Tzeng |
| 6,519,141 B2 | 2/2003 | Tseng et al. |
| 6,536,589 B2 | 3/2003 | Chang |
| 6,614,722 B2 | 9/2003 | Polany et al. |
| 6,646,864 B2 | 11/2003 | Richardson |
| 6,659,274 B2 | 12/2003 | Enners |
| 6,719,381 B2 | 4/2004 | Cleereman et al. |
| 6,781,824 B2 | 8/2004 | Krieger et al. |
| 6,819,549 B1 | 11/2004 | Lammers-Meis et al. |
| 6,842,633 B1 | 1/2005 | Deo et al. |
| 6,865,076 B2 | 3/2005 | Lunsford |
| 6,926,141 B2 | 8/2005 | Montler |
| 6,954,405 B2 | 10/2005 | Polany et al. |
| 6,995,976 B2 | 2/2006 | Richardson |
| 7,011,213 B2 | 3/2006 | Clark et al. |
| 7,050,712 B2 | 5/2006 | Shimamura |
| 7,061,762 B2 | 6/2006 | Canova et al. |
| 7,069,063 B2 | 6/2006 | Halkosaari et al. |
| 7,099,149 B2 | 8/2006 | Krieger et al. |
| 7,158,376 B2 | 1/2007 | Richardson et al. |
| 7,180,735 B2 | 2/2007 | Thomas et al. |
| 7,194,086 B2 | 3/2007 | Pletikosa |
| 7,194,291 B2 | 3/2007 | Peng |
| 7,230,823 B2 | 6/2007 | Richardson et al. |
| 7,263,032 B2 | 8/2007 | Polany et al. |
| 7,312,984 B2 | 12/2007 | Richardson et al. |
| 7,324,642 B2 | 1/2008 | Pletikosa |
| 7,352,961 B2 | 4/2008 | Watanabe et al. |
| 7,400,917 B2 | 7/2008 | Wood et al. |
| 7,449,650 B2 | 11/2008 | Richardson et al. |
| 7,535,799 B2 | 5/2009 | Polany et al. |
| 7,609,512 B2 | 10/2009 | Richardson et al. |
| 7,613,386 B2 | 11/2009 | Shimamura |
| 7,620,174 B1 | 11/2009 | Bick |
| 7,641,046 B2 | 1/2010 | Tsang et al. |
| 7,663,878 B2 | 2/2010 | Swan et al. |
| 7,663,879 B2 | 2/2010 | Richardson et al. |
| 7,688,580 B2 | 3/2010 | Richardson et al. |
| 7,729,493 B2 | 6/2010 | Krieger et al. |
| 7,755,975 B2 | 7/2010 | Pettersen et al. |
| 7,789,228 B2 | 9/2010 | Zenzai |
| 7,810,683 B2 | 10/2010 | Chan |
| 7,876,550 B1 | 1/2011 | Albertini et al. |
| 7,889,489 B2 | 2/2011 | Richardson et al. |
| 7,907,394 B2 | 3/2011 | Richardson et al. |
| 7,920,163 B1 | 4/2011 | Kossin |
| 7,929,847 B2 | 4/2011 | Yim |
| 7,933,122 B2 | 4/2011 | Richardson et al. |
| 7,957,524 B2 | 6/2011 | Chipping |
| 8,044,942 B1 | 10/2011 | Leonhard et al. |
| 8,051,980 B2 | 11/2011 | Tai et al. |
| 8,054,614 B2 | 11/2011 | Albertini et al. |
| 8,068,331 B2 | 11/2011 | Sauers et al. |
| 8,077,453 B2 | 12/2011 | Swan et al. |
| 8,215,483 B2 | 7/2012 | Wakitani et al. |
| 8,245,842 B2 | 8/2012 | Bau |
| 8,240,530 B2 | 10/2012 | Fletcher et al. |
| 8,286,789 B2 | 10/2012 | Wilson et al. |
| 8,342,325 B2 | 1/2013 | Rayner |
| 8,368,748 B2 | 2/2013 | Ho |
| 8,374,495 B2 | 2/2013 | Yim |
| 8,383,216 B1 | 2/2013 | Hynecek |
| 8,390,255 B1 | 3/2013 | Fathollahi |
| 8,393,466 B2 | 3/2013 | Rayner |
| 8,417,303 B2 | 4/2013 | Ladouceur et al. |
| 8,453,835 B2 | 6/2013 | So |
| 8,503,170 B1 | 8/2013 | Hsu et al. |
| 8,526,180 B2 | 9/2013 | Rayner |
| 8,531,824 B2 | 9/2013 | Rayner |
| 8,531,834 B2 | 9/2013 | Rayner |
| 8,564,950 B2 | 10/2013 | Rayner |
| 8,570,737 B2 | 10/2013 | Rayner |
| 8,584,847 B2 | 11/2013 | Tages et al. |
| 8,687,351 B2 | 4/2014 | Yturralde et al. |
| 8,708,142 B2 | 4/2014 | Rayner |
| 8,888,004 B2 | 11/2014 | Setlak et al. |
| 8,915,361 B2 | 12/2014 | Rayner |
| 8,955,678 B2 | 2/2015 | Murphy et al. |
| 9,559,739 B2 | 1/2017 | Murphy et al. |
| 2001/0002003 A1 | 5/2001 | Kuzdak et al. |
| 2001/0002725 A1 | 6/2001 | Pollet et al. |
| 2002/0080567 A1 | 6/2002 | Bone et al. |
| 2002/0137475 A1 | 9/2002 | Shou et al. |
| 2002/0195910 A1 | 12/2002 | Hus et al. |
| 2003/0095374 A1 | 5/2003 | Richardson |
| 2003/0142471 A1 | 7/2003 | Krieger et al. |
| 2003/0151890 A1 | 8/2003 | Huang et al. |
| 2005/0123161 A1 | 6/2005 | Polany et al. |
| 2005/0254778 A1 | 11/2005 | Pettersen et al. |
| 2007/0070813 A1 | 3/2007 | Kuo |
| 2007/0080446 A1 | 4/2007 | Maloney |
| 2007/0086273 A1 | 4/2007 | Polany et al. |
| 2007/0280053 A1 | 12/2007 | Polany et al. |
| 2008/0316687 A1 | 12/2008 | Richardson et al. |
| 2009/0009945 A1 | 1/2009 | Johnson et al. |
| 2009/0017883 A1 | 1/2009 | Lin |
| 2009/0017884 A1 | 1/2009 | Rotschild |
| 2009/0032420 A1 | 2/2009 | Zenzai |
| 2009/0080153 A1 | 3/2009 | Richardson et al. |
| 2009/0206001 A1 | 8/2009 | Sasaki et al. |
| 2009/0303673 A1 | 12/2009 | Holzhausen |
| 2009/0312058 A9 | 12/2009 | Wood et al. |
| 2010/0008028 A1 | 1/2010 | Richardson et al. |
| 2010/0048267 A1 | 2/2010 | Lin |
| 2010/0147737 A1 | 6/2010 | Richardson et al. |
| 2010/0200456 A1 | 8/2010 | Parkinson |
| 2010/0203850 A1 | 8/2010 | Norris et al. |
| 2010/0211382 A1 | 8/2010 | Sugiyama |
| 2010/0328203 A1 | 12/2010 | Hsu |
| 2011/0036876 A1 | 2/2011 | Fathollahi |
| 2011/0073608 A1 | 3/2011 | Richardson et al. |
| 2011/0157800 A1 | 6/2011 | Richardson et al. |
| 2011/0163642 A1 | 7/2011 | Rohrbach et al. |
| 2011/0195759 A1 | 8/2011 | Griffin et al. |
| 2011/0228458 A1 | 9/2011 | Richardson et al. |
| 2012/0000908 A1 | 1/2012 | So |
| 2012/0008300 A1 | 1/2012 | Ladouceur et al. |
| 2012/0018773 A1 | 1/2012 | Chen et al. |
| 2012/0039023 A1 | 2/2012 | Renwick |
| 2012/0043235 A1 | 2/2012 | Klement |
| 2012/0074005 A1 | 3/2012 | Johnson et al. |
| 2012/0118773 A1* | 5/2012 | Rayner ............... G06F 1/1626 |
| | | 206/320 |
| 2012/0211382 A1 | 8/2012 | Rayner |
| 2012/0244915 A1 | 9/2012 | Hawkins et al. |
| 2012/0262618 A1 | 10/2012 | Weakly |
| 2012/0263618 A1 | 10/2012 | Ward et al. |
| 2012/0302294 A1 | 11/2012 | Hammond et al. |
| 2013/0042581 A1 | 2/2013 | Holben et al. |

(56) References Cited

U.S. PATENT DOCUMENTS

| | | | |
|---|---|---|---|
| 2013/0126372 A1 | 5/2013 | Song | |
| 2013/0146491 A1* | 6/2013 | Ghali | G06F 1/1626 206/320 |
| 2013/0271902 A1 | 10/2013 | Lai et al. | |
| 2014/0054084 A1* | 2/2014 | Pan | H05K 5/02 174/549 |
| 2014/0152890 A1* | 6/2014 | Rayner | G06F 1/1626 348/376 |
| 2014/0217862 A1 | 8/2014 | Rayner | |
| 2014/0217863 A1 | 8/2014 | Rayner | |
| 2014/0262847 A1* | 9/2014 | Yang | A45C 11/00 206/37 |
| 2014/0265762 A1* | 9/2014 | Murphy | B23P 19/00 312/223.1 |
| 2017/0054466 A1* | 2/2017 | Flores | H04B 1/3888 |

FOREIGN PATENT DOCUMENTS

| | | |
|---|---|---|
| DE | 29811904 | 3/1998 |
| EP | 1 583 251 | 10/2005 |
| EP | 2 779 599 | 9/2014 |
| JP | 2008-153058 | 7/2008 |
| JP | 2012-109715 | 6/2012 |
| WO | WO-83/00673 | 3/1983 |
| WO | WO-2012/002899 | 1/2012 |
| WO | WO-2013/181644 | 12/2013 |

OTHER PUBLICATIONS

Canadian Examiner's Report dated Aug. 31, 2016, from related application No. 2,844,371.

Canadian Official Action dated Mar. 4, 2015, from related Canadian Patent Application No. 2,844,371.

Catalyst Waterproof, Stealth Black iPhone 4/4s EscapeCapsule http://www.catalystlifestyle.com/products/ec-stealth, 2013.

Australian Official Action dated Mar. 27, 2015, issued in related Australian Patent Application No. 2014201391.

EPO Official Action dated Sep. 22, 2014, from related European Patent Application No. 14159864.9.

Japanese Official Action dated Mar. 18, 2015, issued in related Japanese Patent Application No. 2014-051074.

European Office Action dated Dec. 18, 2015, from related application No. 14159864.9.

Extended European Search Report dated Jan. 5, 2017, from related application No. 16184680.3.

Griffin, Survivor catalyst Waterproof, Our New Waterproof Case for iPhone 5, http://griffintechnology.com/survivor/waterproof. 2013.

Hitcase, Hitcase for iPhone 4/4s ~ The World's Most Versatile iPhone Case, http://www.hitcase.com/hitcase, 2013.

Incipio—Atlas—iPhone 5 Waterproff Cases, IncipioTV, publ Jan. 15, 2013, http://www.youtube.com/watch?v=7dRWednhByM.

Incipio, Atlas Waterproof Case, Where you go, Atlas Goes, http://atlas.incipio.com, 2013.

Notice of Allowance dated Oct. 7, 2014, from related U.S. Appl. No. 13/830,180.

Optrix, Optrix XD5 for iPhone 5, 5, Turn your iPhone into a Sports Action Video Camera, http://www.optrix.com/optrix-xd5,2013.

Outdoor Tech, Waterproof Cases, http://www.outdoortechnology.com/Shop/Cases/.

Seidio, Obex Waterproof Case, Redesigned for the Samsung Galaxy S4, http://www.seidio.com/obex/.

The Joy Factory, aXtion Pro for iPhone 5, http://www.thejoyfactory.com/product/cwd100.

U.S. Office Action dated Jun. 2, 2014, from related U.S. Appl. No. 13/380,180.

U.S. Notice of Allowance dated Sep. 27, 2016, from U.S. Appl. No. 14/602,163.

U.S. Office Action dated Apr. 4, 2016 from U.S. Appl. No. 14/602,163.

U.S. Office Action dated Jul. 15, 2016 from U.S. Appl. No. 14/602,163.

U.S. Office Action dated Jun. 2, 2014, from U.S. Appl. No. 13/830,180.

U.S. Office Action dated Mar. 10, 2017, from U.S. Appl. No. 14/964,352.

U.S. Office Action dated Nov. 5, 2015, from related U.S. Appl. No. 14/602,163.

* cited by examiner

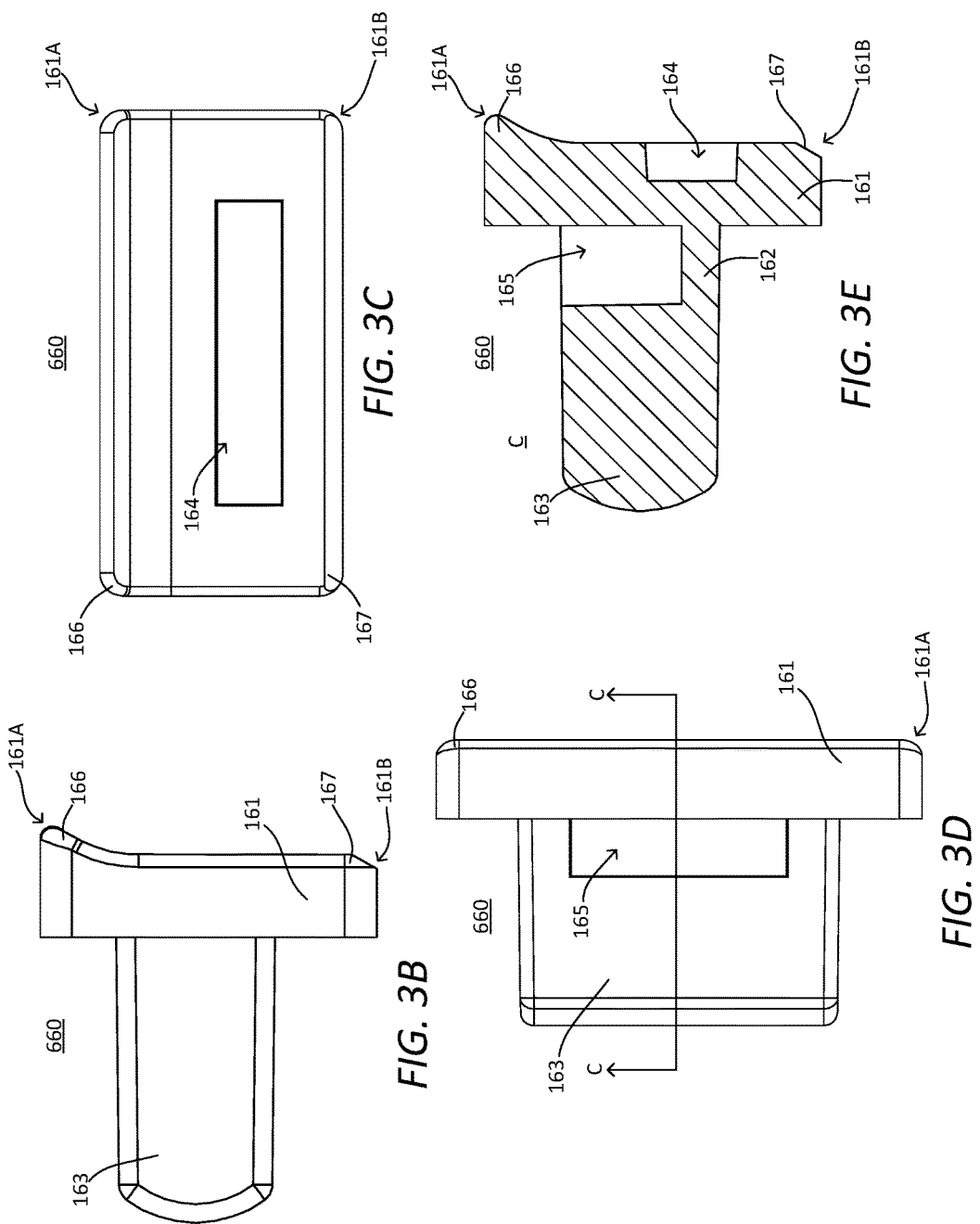

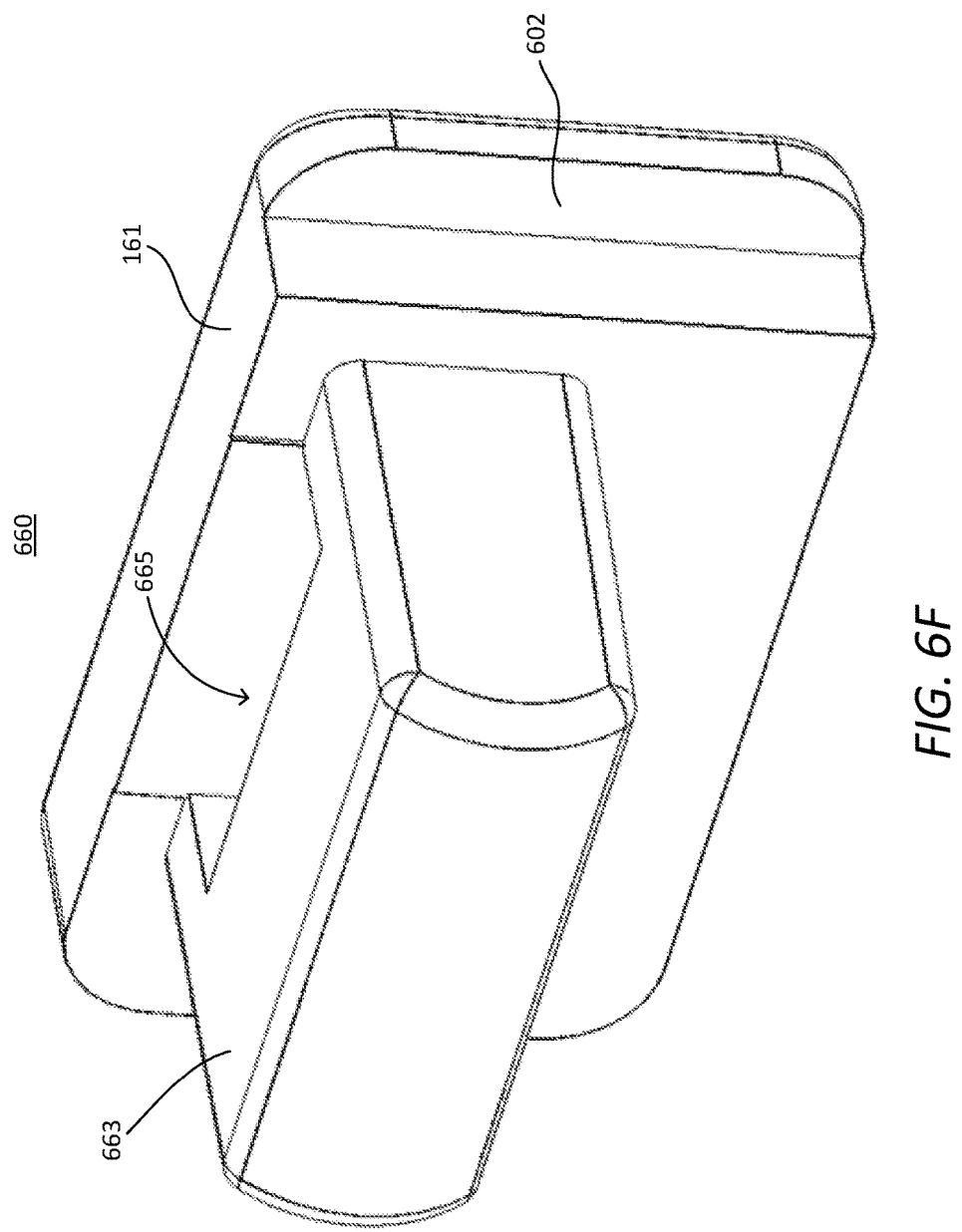

CONTROL FEATURE OF A PROTECTIVE CASE FOR ENGAGING A SWITCH OF AN ELECTRONIC DEVICE

BACKGROUND

1. Field

The disclosure relates generally to protective cases and, in particular embodiments, to protective cases for electronic devices.

2. Background

Electronic devices, such as smart phones, tablets, or the like, typically contain sensitive and/or delicate electronics or other components. These devices can be subject to physical abuse and risks of damage from handling, especially given the portable nature of the devices (e.g., dropping, or otherwise subjecting the devices to physical shock or other trauma, etc.). In addition, because they contain sensitive electronics, electronic devices are particularly susceptible to damage caused by liquids (e.g., a mobile phone may be rendered completely inoperable after being exposed to water). Electronic devices typically include housings that can withstand a certain level of physical shock or water exposure. However, in an effort to improve aesthetics, the housings are typically designed to have finishes that look appealing, but often at the compromise of structural integrity. Accordingly, a protective case that encloses some or the entire electronic device can provide an additional level of protection to the sensitive electronics and the housing of the electronic device.

Examples of protective cases for electronic devices are described in U.S. patent application Ser. No. 14/964,352 filed on Dec. 9, 2015 and titled "Protective Case for Mobile Electronic Communication Device" and in U.S. patent application Ser. No. 13/830,180 filed on Mar. 14, 2013 and titled "Protective Cases for Mobile Electronic Communication Devices," each of which is incorporated herein by reference in its entirety.

SUMMARY

Embodiments of the present disclosure relate to a protective case for an electronic device having one or more operators.

According to various embodiments, there is provided a case for an electronic device. The case includes a cover having a peripheral wall defining an interior for receiving at least a portion of the electronic device. The cover has a protrusion extending in a length dimension. The case further includes a control feature extending through the peripheral wall of the cover. The control feature has a first body portion configured to engage a switch of the electronic device, when the electronic device is received in the interior of the cover. The control feature further has a second body portion accessible from outside of the interior of the cover. The control feature further has a central body portion between the first body portion and the second body portion, the central body portion having a channel in which the protrusion is received, wherein the control feature is moveable along the length dimension of the protrusion, relative to the cover.

In some embodiments, the control feature extends through an opening in the peripheral wall of the cover and the protrusion extends at least partially into the opening.

In some embodiments, the protrusion extends into the channel a length sufficient to inhibit the control feature from separating from the cover, throughout a full range of motion of the control feature relative to the cover.

In some embodiments, the first body portion has a chamber having an interior volume for receiving a portion of the switch of the electronic device, when the electronic device is received in the interior of the cover.

In some embodiments, the channel in the central body portion has a depth dimension that extends in a direction transverse to a direction of a depth dimension of the chamber in the first body portion.

In some embodiments, the control feature including the first body portion, the second body portion, and the central body portion is formed as a single, unitary structure.

In some embodiments, the first body portion has a first end and a second end opposite the first end, the control feature further having a lip extending from the first end of the first body.

In some embodiments, the lip is configured to provide a concave curvature of the first body portion such that the curvature substantially conforms to a convex curvature of a body of the electronic device when the electronic device is housed in the case.

In some embodiments, the second end of the first body portion has an angled edge, the angled edge being angled away from the electronic device when the electronic device is housed in the protective case.

In some embodiments, the case further includes a second cover configured to couple with the cover having the peripheral wall for housing the electronic device between the second cover and the cover having the peripheral wall.

In some embodiments, the cover having the peripheral wall is a front cover configured to be positioned at an interactive display of the electronic device, and the control feature is located at the front cover.

In some embodiments, the second cover is a rear cover configured to be positioned at a rear surface of the electronic device, and the control feature is located at the rear cover.

In some embodiments, the control feature is configured to be positioned at a first position and at a second position different from the first position.

In some embodiments, the first position is below the second position along a height defined by a length of the protrusion.

According to various embodiments, a method of manufacturing a case for an electronic device includes providing a cover having a peripheral wall defining an interior for receiving at least a portion of the electronic device. The cover has a protrusion extending in a length dimension. The method further includes providing a control feature extending through the peripheral wall of the cover. The control feature has a first body portion configured to engage a switch of the electronic device, when the electronic device is received in the interior of the cover. The control feature further has a second body portion accessible from outside of the interior of the cover. The control feature further has a central body portion between the first body portion and the second body portion, the central body portion having a channel in which the protrusion is received, wherein the control feature is moveable along the length dimension of the protrusion, relative to the cover.

In some embodiments, the control feature extends through an opening in the peripheral wall of the cover and the protrusion extends at least partially into the opening.

In some embodiments, the protrusion extends into the channel a length sufficient to inhibit the control feature from separating from the cover, throughout a full range of motion of the control feature relative to the cover.

In some embodiments, the first body portion has a chamber having an interior volume for receiving a portion of the switch of the electronic device, when the electronic device is received in the interior of the cover.

In some embodiments, the channel in the central body portion has a depth dimension that extends in a direction transverse to a direction of a depth dimension of the chamber in the first body portion.

According to various embodiments, a protective case configured to house an electronic device includes a front cover having a peripheral wall defining an interior for receiving at least a portion of the electronic device, the front cover having a protrusion extending in a length dimension. The case further includes a rear cover configured to couple with the front cover. The case further includes, a control feature extending through the peripheral wall of the front cover. The control feature has a first body portion configured to engage a switch of the electronic device, when the electronic device is received in the interior of the cover. The control feature further has a second body portion accessible from outside of the interior of the cover. The control feature further has a central body portion between the first body portion and the second body portion, the central body portion having a channel in which the protrusion is received, wherein the control feature is moveable along the length dimension of the protrusion, relative to the cover.

BRIEF DESCRIPTION OF THE DRAWINGS

FIG. 3B is a side view of a control feature of a protective case according to various embodiments.

FIG. 3C is a front view of a control feature of a protective case according to various embodiments.

FIG. 3D is a top view of a control feature of a protective case according to various embodiments.

FIG. 3E is a cross-section view of section C shown in FIG. 3D of a control feature of a protective case according to various embodiments.

FIG. 6F is a rear perspective view of a control feature of a protective case according to various embodiments.

DETAILED DESCRIPTION

Figure 1A:
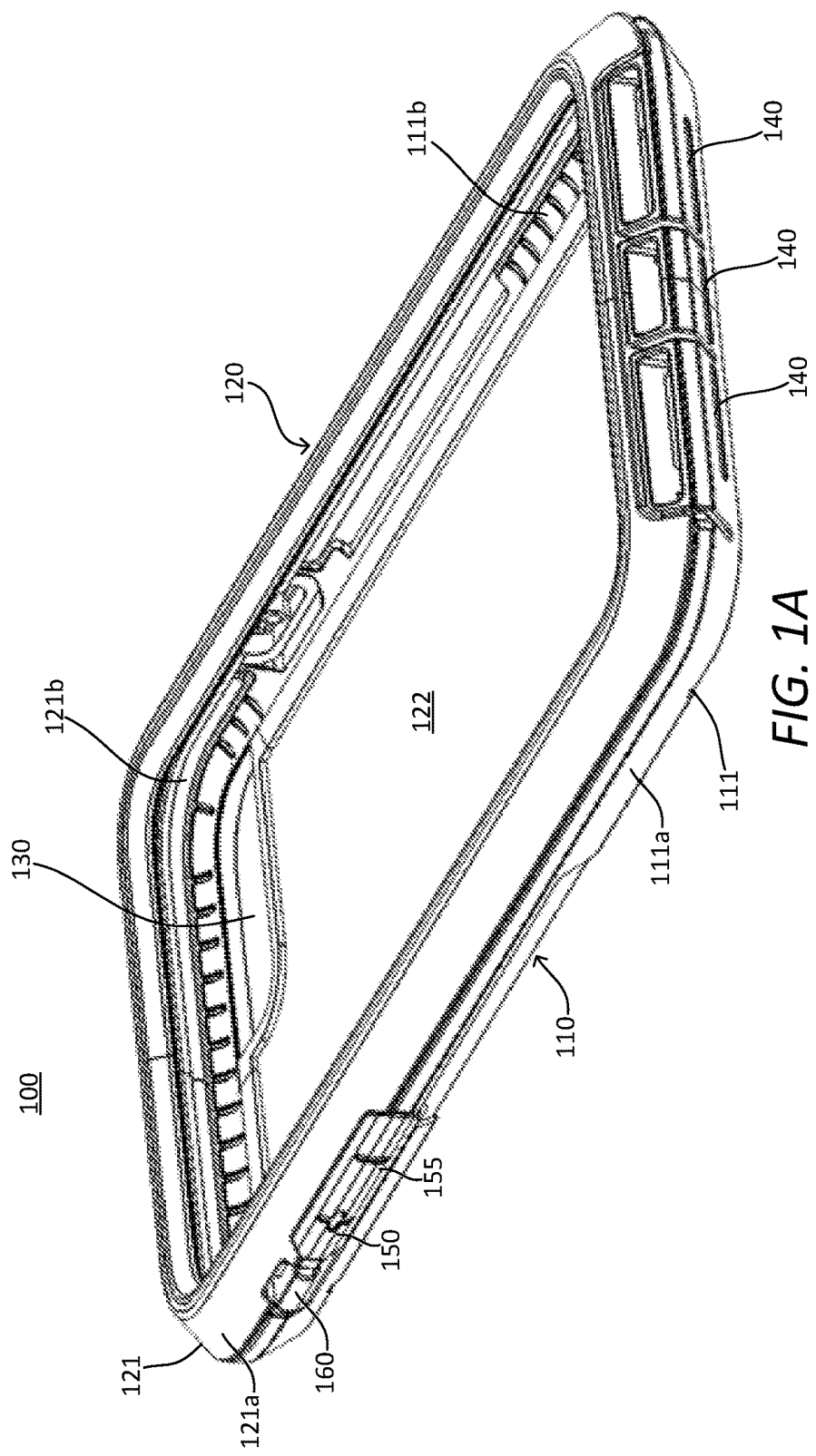
FIG. 1A is a perspective view of a protective case according to various embodiments.
Figure 1B:
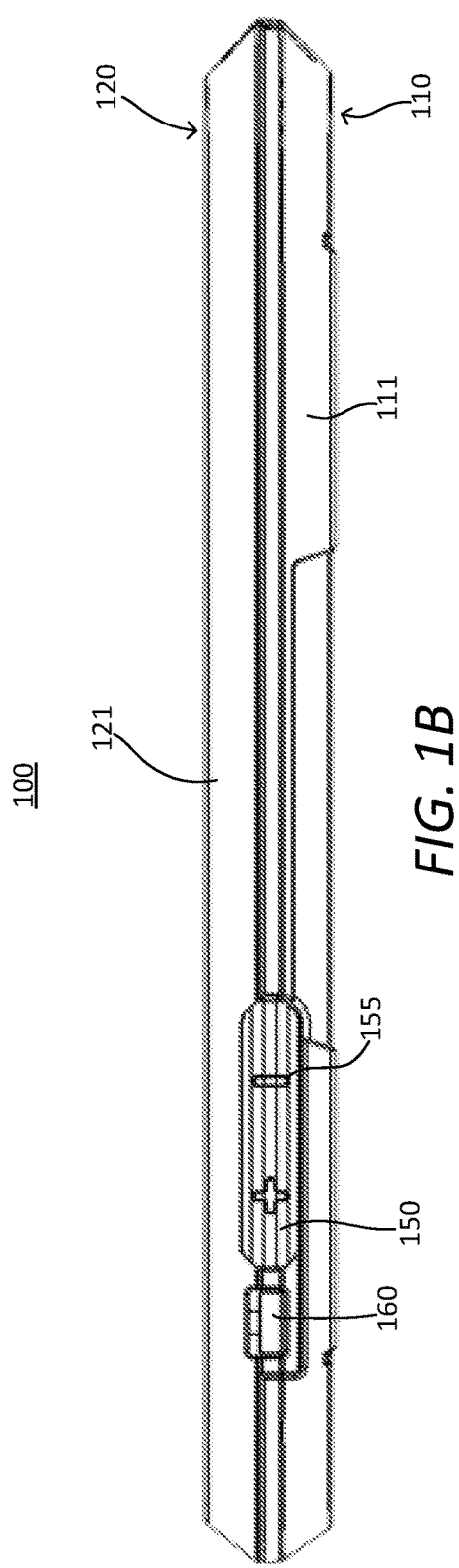
FIG. 1B is a side view of a protective case according to various embodiments.
Figure 1C:
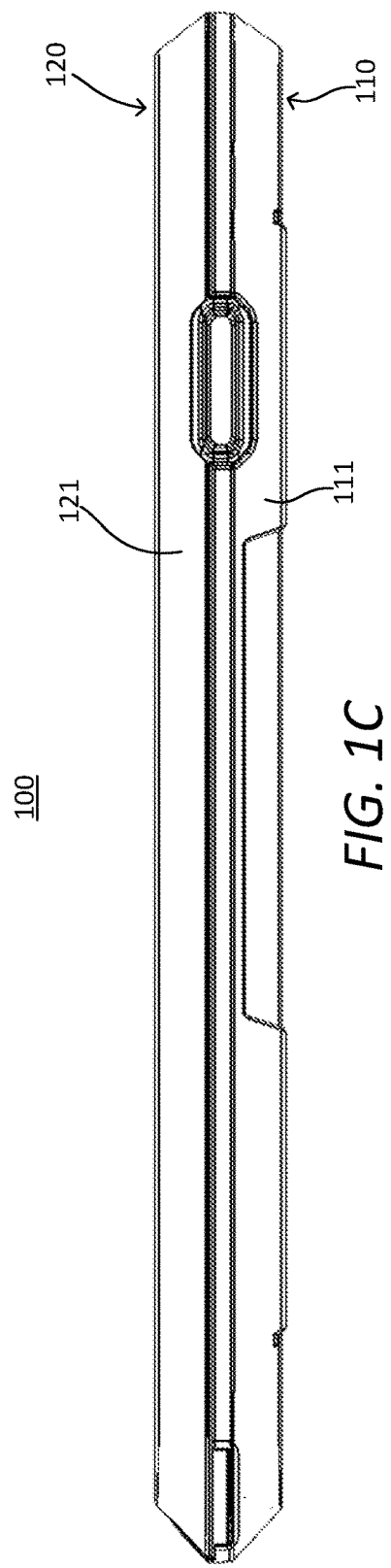
FIG. 1C is another side view of a protective case according to various embodiments.
Figure 1D:
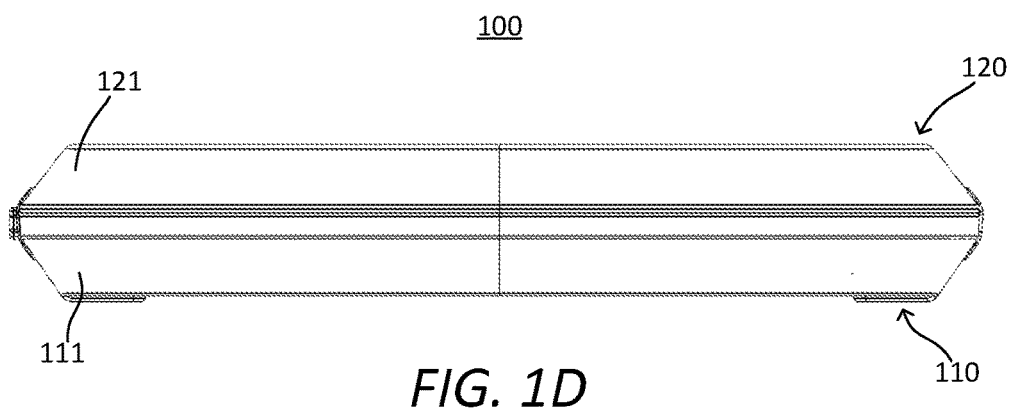
FIG. 1D is a top view of a protective case according to various embodiments.
Figure 1E:
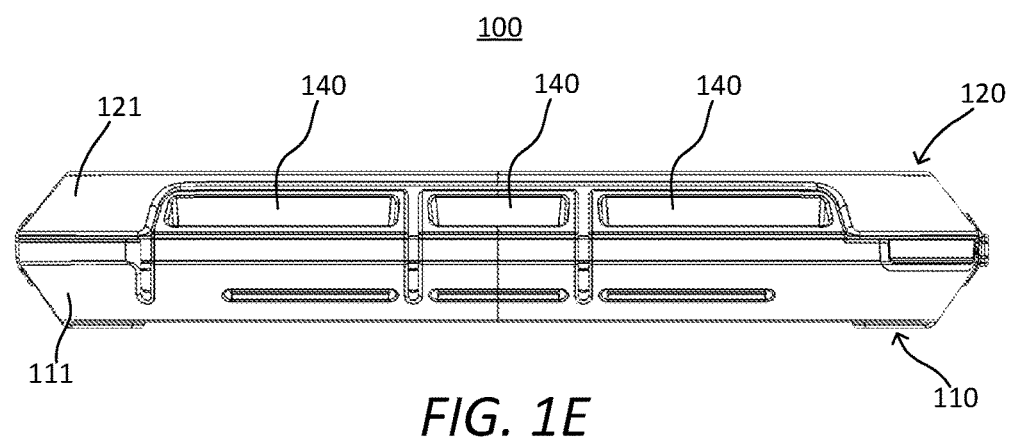
FIG. 1E is a bottom view of a protective case according to various embodiments.
Figure 1G:
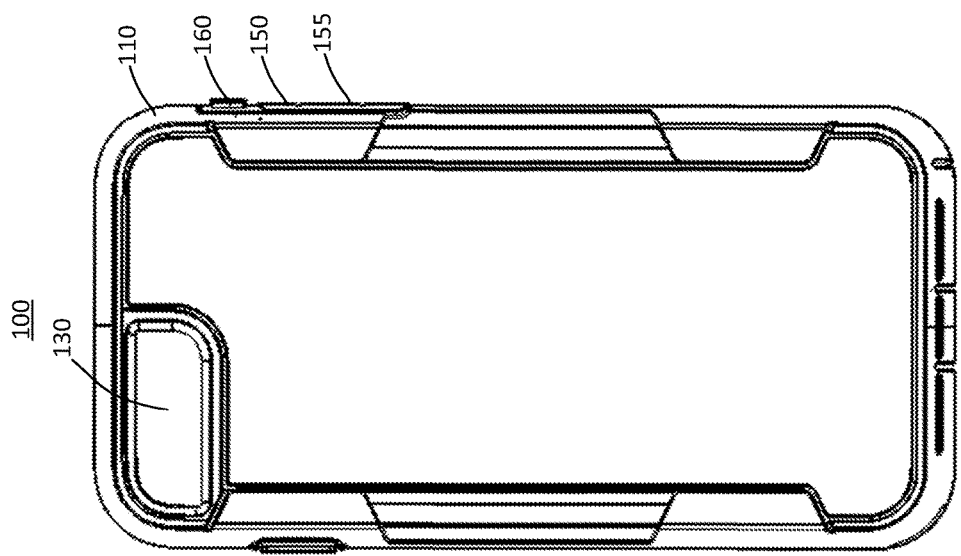
FIG. 1G is a view of a rear cover of a protective case according to various embodiments.
Figure 1F:
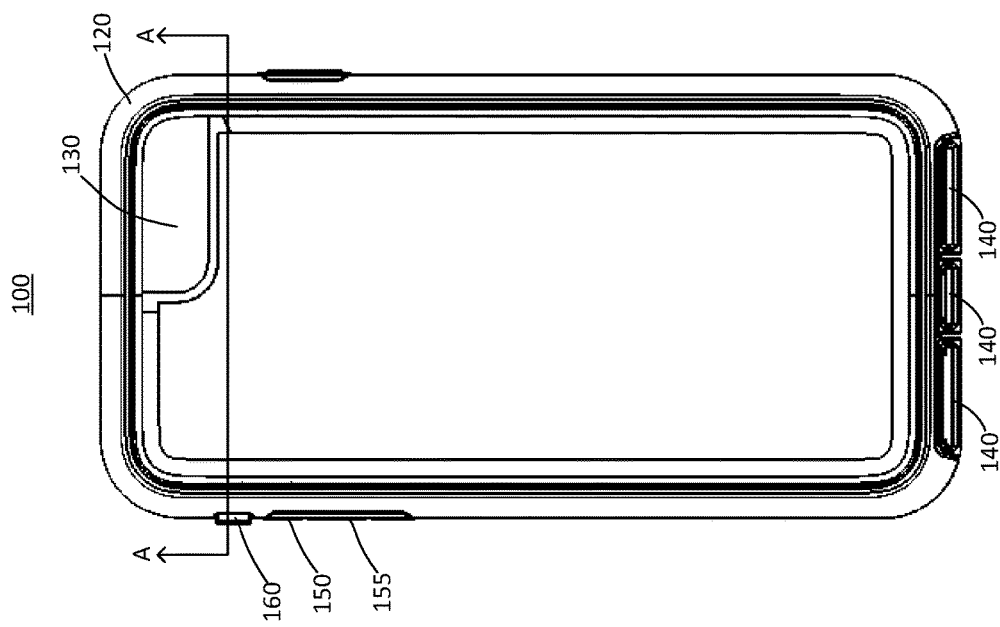
FIG. 1F is a view of a front cover of a protective case according to various embodiments.

FIG. 1A is a perspective view of a protective case 100 according to various embodiments. FIG. 1B is a side view of the protective case 100 according to various embodiments. FIG. 1C is another side view of the protective case 100 according to various embodiments. FIG. 1D is a top view of the protective case 100 according to various embodiments. FIG. 1E is a bottom view of the protective case 100 according to various embodiments. FIG. 1F is a view of the front cover 110 of the protective case 100 according to various embodiments. FIG. 1G is a view of a rear cover 120 of the protective case 100 according to various embodiments.

Referring to FIGS. 1A-1G, according to various embodiments, the protective case 100 includes the rear cover 110 and the front cover 120 that, when coupled, form a volume in the protective case 100. The volume in the protective case 100 may be configured to hold an electronic device (not shown), such as, but not limited to, a smart phone (e.g., iPhone or other smart phone) or other cell phone, a tablet (e.g., iPad or other tablet), a personal data assistant (PDA), a laptop, an MP3 player, a music player, a video player, a media player, a navigational device, a telematics device, or any other portable electronic device. The electronic device may include a display device (e.g., LCD screen, etc.), a user input interface (e.g., keyboard, touchscreen interface, etc.) for providing an input or otherwise interacting with the electronic device, and/or the like. In particular embodiments, the electronic device includes a touchscreen for the display device and the user input interface.

In various embodiments, the rear cover 110 and/or the front cover 120 are made of any suitable material. In particular embodiments, the rear cover 110 and/or the front cover 120 are made from materials that are capable of providing one or more of shock and liquid resistance to an encased electronic device, when the rear cover 110 and the front cover 120 are coupled around the encased device. In some embodiments, the rear cover 110 and the front cover 120 are composed of a plurality of different components and therefore may be fabricated from a plurality of different materials. Suitable materials from which the rear cover 110 and/or the front cover 120 may be made of include, but are not limited to, rigid, semi-rigid, flexible, or any other type of material adapted to provide a corresponding desired amount of protection to the electronic device (e.g., shock and/or liquid resistance) including, but not limited to, plastic, metal, polycarbonate, nylon, liquid crystal polymer, rubber, thermal plastic urethane, polyethylene, polypropylene, a combination thereof, a mixture thereof, and/or the like.

In various embodiments, the protective case 100 completely encloses the electronic device. For instance, the rear cover 110 and the front cover 120, when coupled together, may completely enclose the electronic device. In other embodiments, the protective case 100 covers a portion of the electronic device. In such embodiments, a remaining portion of the electronic device remains exposed.

According to various embodiments, the front cover 120 includes a front outer body 121. The front outer body 121 may form some or all of the perimeter of the protective case 100 such that the front outer body 121 encompasses a portion or an entirety of the edges of an electronic device when the electronic device is encased in the protective case 100. In some embodiments, the front outer body 121 encompasses a portion of the edges of an electronic device, for example, but not limited to, half of the height (e.g., in a direction extending from the front cover 120 to the rear cover 110) of the perimeter edges of the electronic device.

In some embodiments, the front outer body 121 includes a front outer peripheral wall 121a facing towards an outside of the protective case 100, and a front inner peripheral wall 121b facing the opposite direction from which the front outer peripheral wall 121a faces (e.g., towards the electronic device when the device is encased in the protective case 100). In some embodiments, the outer peripheral wall 121a and the inner peripheral wall 121b are made from the same material. In other embodiments, the outer peripheral wall 121a and the inner peripheral wall 121b are made from different materials. The outer peripheral wall 121a and the inner peripheral wall 121b may be made from any suitable material for providing protection to the encased electronic device, such as, but not limited to, an elastomeric material, plastic, metal, polycarbonate, nylon, liquid crystal polymer, rubber, thermal plastic urethane, polyethylene, polypropylene, a combination thereof, a mixture thereof, and/or the like.

According to various embodiments, the rear cover 110 includes a rear outer body 111. The rear outer body 111 may form some or all of the perimeter of the protective case 100 such that the rear outer body 111 encompasses a portion or an entirety of the edges of an electronic device when the electronic device is encased in the protective case 100. In some embodiments, the rear outer body 111 encompasses a portion of the edges of an electronic device, for example, but not limited to, half of the height (e.g., in a direction extending from the rear cover 110 to the front cover 120) of the perimeter edges of the electronic device.

In some embodiments, the rear outer body 111 includes a rear outer peripheral wall 111a facing towards an outside of the protective case 100, and a rear inner peripheral wall 111b facing the opposite direction from which the outer peripheral wall 111a faces (e.g., towards the electronic device when the device is encased in the protective case 100). In some embodiments, the outer peripheral wall 111a and the inner peripheral wall 111b are made from the same material. In other embodiments, the outer peripheral wall 111a and the inner peripheral wall 111b are made from different materials. The outer peripheral wall 111a and the inner peripheral wall 111b may be made from any suitable material for providing protection to the encased electronic device, such as, but not limited to, an elastomeric material, plastic, metal, polycarbonate, nylon, liquid crystal polymer, rubber, thermal plastic urethane, polyethylene, polypropylene, a combination thereof, a mixture thereof, and/or the like.

In some embodiments, the inner peripheral wall 111b is made from a relatively soft material for cushioning or retaining a housed electronic device (e.g., the material of the inner peripheral wall 111b may be softer than the material of the outer peripheral wall 111a). In some embodiments, the material of the inner peripheral wall 111b is overmolded onto the material of the outer peripheral wall 111a. For example, the material of the inner peripheral wall 111b may be soft silicon and the material of the outer peripheral wall 111a may be harder polyvinyl chloride (PVC), and the silicon inner peripheral wall 111b may be overmolded onto the PVC outer peripheral wall 111a.

In some embodiments, both the inner peripheral wall 111b of the rear cover 110 and the inner peripheral wall 121b of the front cover 120 define an interior or cavity 122 in which an entirety or a portion of the electronic device is configured to reside. In some embodiments, the inner peripheral wall 111b of the rear cover 110 defines the entire cavity. In other embodiments, the inner peripheral wall 121b of the front cover 120 defines the entire cavity.

An electronic device may be mounted or otherwise arranged in the protective case 100 in any suitable manner. In some embodiments, the electronic device may be received in the front cover 120. For instance, the front outer body 121 may define the cavity 122 for receiving (at least a portion of) the electronic device. In some embodiments, the electronic device may be received in the rear cover 110. For instance, the outer body 111 may define the cavity 122 for receiving (at least a portion of) the electronic device. In other embodiments, the electronic device is mounted to the protective case 100 by attaching the electronic device to the protective case 100, for example, with a fastener, adhesive, and/or the like.

In various embodiments, the rear cover 110 and the front cover 120 are configured to couple or mate in any suitable manner to enclose the electronic device in the protective case 100. In particular embodiments, at least a portion of the rear cover 110 is received into a portion of the front cover 120 or vice versa. For example, the rear cover 110 and the front cover 120 may couple together by joining their respective outer bodies 111, 121 at the edges by, for example, but not limited to, snap-fitting the rear cover 110 and the front cover 120 together.

The electronic device may include at least one camera or other video/image/data capture device. In particular embodiments, the protective case 100 is configured to allow an image or the like to be captured through the protective case 100. In particular embodiments, the rear cover 110 includes one or more openings 130 arranged to align with a lens of a rear-facing camera and/or a light source (e.g., for providing flash photography in conjunction with the rear-facing camera) of the electronic device. In further embodiments, the one or more openings 130 is covered by a transparent portion (e.g., an optically clear lens) arranged to align with the camera lens, the light source, and/or the like. The transparent portion may be formed as an integral feature of the protective case 100 or may be a separate part formed separately and assembled to the protective case 100.

In some embodiments, the protective case 100 includes a movable door arranged over the lens to selectively open to allow the camera to capture an image of an object outside the protective case 100. In some embodiments, the front cover 120 may be configured to allow an image or the like to be captured through the protective case 100 by a front-facing camera. For example, the front cover 110 may include an aperture or otherwise provide access to the front-facing camera of the electronic device (e.g., through a transparent membrane).

In further embodiments, the one or more openings 130 and/or the aperture for the front-facing camera may be surrounded by a gasket (e.g., O-ring) or the like for providing a seal at the openings and/or aperture. In particular embodiments, the gasket is made of a pliable material, such as, but not limited to, liquid silicone rubber, microcellular urethane (e.g., PORON®), and/or the like.

The electronic device may have one or more indicator lights on one or more suitable portions of the electronic device to indicate information, such as a status light for power, communication, battery status, or other functions (e.g., new voicemail, email, text message, or other message). In some embodiments, the indicator lights are in positions on the electronic device that are not readily viewable through a membrane (not shown) or other portion of the protective case 100. In particular embodiments, the protective case 100 is configured to allow the indicator lights to be visible through at least a portion of the protective case 100. For example, the rear cover 110 and/or the front cover 120 of the protective case 100 may include one or more transparent portions, light pipes, or the like that transmit light from the electronic device to outside of the protective case 100.

In some embodiments, the transparent portions are constructed of a transparent (or semi-transparent) material. The transparent portions may be formed as an integral feature of the protective case 100 or may be separate parts that are formed separately and assembled to the protective case 100. In other embodiments, the indicator lights of the electronic device are visible to outside of the protective case 100 through a membrane (not shown) over the interactive display of the electronic device. According to various embodiments, the transparent portions are made of any suitable transparent material, such as, but not limited to, glass, plastic, vinyl, and/or the like.

The electronic device may further include one or more audio devices, such as speakers, headphone jacks, microphones for receiving audio signals, etc. In particular embodiments, the protective case 100 may be configured to transmit audio signals through the protective case 100 to/from the one or more of the audio devices. For example, the rear cover 110 and/or the front cover 120 of the protective case 100 may include one or more openings to the one or more of the audio devices. In further embodiments, the opening includes one or more plugs 140 to selectively open to allow access to the opening for the speaker, microphone jack, and/or the like.

In particular embodiments, the plugs 140 is configured to pivot, slide, hinge, or open in any suitable manner that allows access to the opening to the one or more audio devices. In some embodiments, the plugs 140 may include an annular gasket (e.g., O-ring) configured to surround a portion of the plugs 140. The gasket may be configured to seal (e.g., from liquid) the opening when the plugs 140 is situated within the opening to the audio device.

In some embodiments, the plugs 140 are configured to tightly fit in the opening to the one or more audio devices for suitably sealing the opening. In further embodiments, the plugs 140 are fastened to the protective case 100 by a tether. In some embodiments, the one or more plugs 140 are made from any suitable material, such as, but not limited to, elastomeric material, plastic, metal, polycarbonate, nylon, liquid crystal polymer, rubber, thermal plastic urethane, polyethylene, polypropylene, a combination thereof, a mixture thereof, and/or the like.

In some embodiments, the electronic device has at least one interface for communicating with another device (e.g., a computer, a speaker, a charging device, etc.) and/or for charging the electronic device. The interface may be a direct electrical connection, such as through a cable, for example (but not limited to) a USB cable and/or the like. Alternatively, or in addition, the interface may be a wireless connection, for example (but not limited to) Wi-Fi, Bluetooth, and/or the like. In particular embodiments, the protective case 100 is configured to allow access to one or more of the interfaces, such as an interface that allows for a direct electrical connection. For example, the protective case 100 may include an interface opening that aligns with the interface of the electronic device when the electronic device is received in the cavity 122 of the protective case 100. In further embodiments, the interface opening may also be covered by one of the plugs 140 or the like for allowing selective access to the interface opening to the interface of the electronic device.

The electronic device may include one or more operators (e.g., buttons, switches, etc.) as part of the user input interface for the electronic device. The operator(s) may provide various functions, such as, but not limited to, powering on/off the electronic device, changing a sound volume of the electronic device, toggling audio/vibration (e.g., a ringer of the electronic device), or performing other functions on the electronic device (e.g., a "Home" button). The button sizes, quantity, layouts, and functions may vary for each manufacturer and model of the electronic device.

As such, in various embodiments, the protective case 100 is configured to allow actuation of one or more operators of the electronic device while the electronic device is encased in the protective case 100. For instance, the protective case 100 may include one or more members or other features that are arranged to interact with one or more of the electronic device operators. In some embodiments, a moveable member is provided on the protective case 100 at a position to interact with the one or more operators of the electronic device (received in the cavity 122) to transmit mechanical motion from outside of the protective case 100 to the one or more operators of the electronic device. In particular embodiments, the moveable member is a flexible or pliable member or portion of the protective case 100.

In some embodiments, the moveable member is a moveable body, such as a plunger or the like, configured to transmit mechanical movement from outside of the protective case 100 to one or more of the operators of the electronic device. For example, a first button plunger 150 (e.g., corresponding to a volume up button of the electronic device) and a second button plunger 155 (e.g., corresponding to a volume down button of the electronic device) may be provided in the front cover 120 and/or the rear cover 110 to transmit a force, applied to the first button plunger 150 or the second button plunger 155, to the volume up button or volume down button of the electronic device. Thus, in various embodiments, movement of a feature of the protective case 100 moves in a same (or parallel) direction as a direction in which a corresponding operator of the electronic device is moved. According to various embodiments, the button plungers is made of any suitable flexible or pliable material, such as, but not limited to, liquid silicone rubber (LSR), microcellular urethane (e.g., PORON®), and/or the like.

In other embodiments, the protective case 100 is configured to provide access to one or more of the electronic device operators. For example, the protective case 100 may include an opening to allow a user to access (e.g., actuate) one or more of the electronic device operators. It should be noted that the electronic device may include any suitable type or number of operators, and/or the protective case 100 may include any suitable type or number of members arranged to interact with such operators. For example, the protective case 100 may include a pivoting or rocking member for actuating (at least) two of the operators (such as, but not limited to, the volume up button and volume down button) of the electronic device.

In some embodiments, the protective case 100 is configured to allow actuation of one or more switches of the electronic device while the electronic device is encased in the protective case 100. For instance, the protective case 100 may include one or more members or other features that are arranged to interact with one or more of the electronic device switches. In some embodiments, a control feature is provided on the protective case 100 at a position to interact with the one or more switches of the electronic device (received in the cavity 122) to transmit mechanical motion from outside of the protective case 100 to the one or more switches of the electronic device. In particular embodiments, the control feature is a rigid laterally movable switch of the protective case 100. For example, the protective case 100 may include at least one control feature 160 (e.g., a switch 160) that is arranged in the front cover 120 to transmit a force applied to the control feature 160 to a switch of the electronic device located on a side surface of the electronic device. In other embodiments, the control feature 160 is arranged in the rear cover 110.

In some embodiments, the protective case 100 includes the control feature 160 configured to transmit mechanical movement to a corresponding operator of the electronic device, such as, but not limited to, an audio/vibration (AV) switch or a mute switch. The control feature 160 may be located in correspondence with the AV switch of the electronic device. For example, the control feature 160 may be located at the same side of the outer body 111 or 121 at which the button plungers 150 and 155 are located, and may be proximate the button plungers 150 and 155. In other embodiments, the control feature 160 may be located at a different side of the outer body 111 or 121 relative to the side at which the button plungers 150 and 155 are located, or may be located on the same side but separated from and not proximate to the button plungers 150 and 155. In some embodiments, the control feature 160 is located at the outer body 111, while the button plungers 150 and 155 are located at the outer body 121, or vice versa. In other embodiments, the control feature 160 and the button plungers 150 and 155 are located at the same outer body 111 or 121.

Figure 2A:
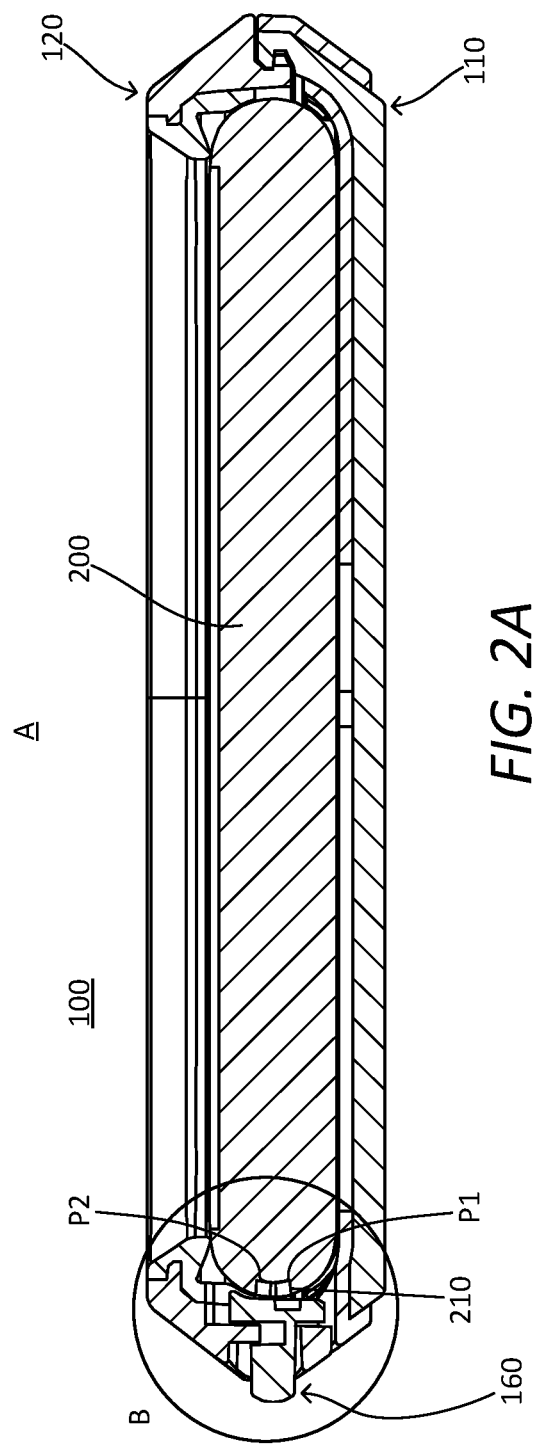
FIG. 2A is a cross-section view of section A shown in FIG. 1F of a protective case according to various embodiments.
Figure 2B:
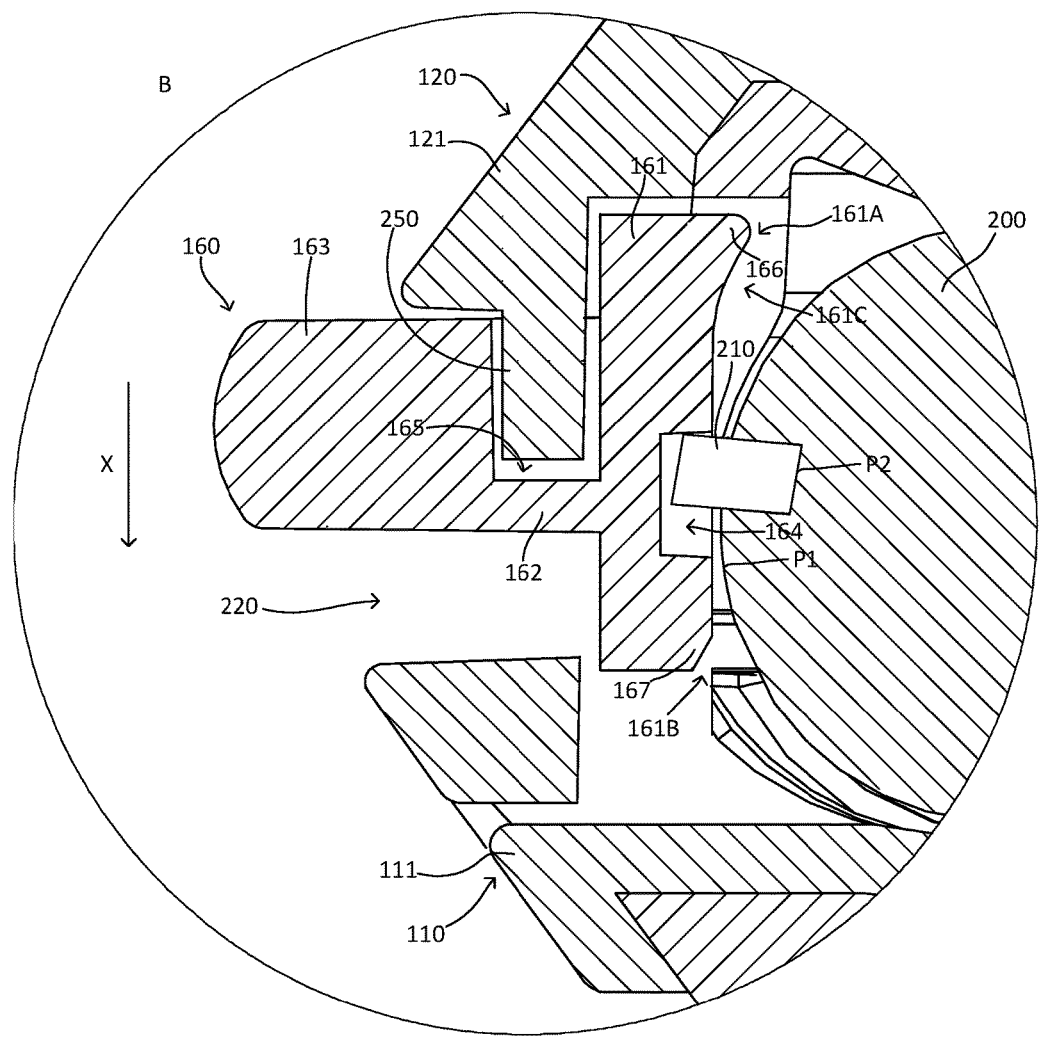
FIG. 2B is an enlarged view of section B shown in FIG. 2A of a cross-section of a protective case according to various embodiments.
Figure 2C:
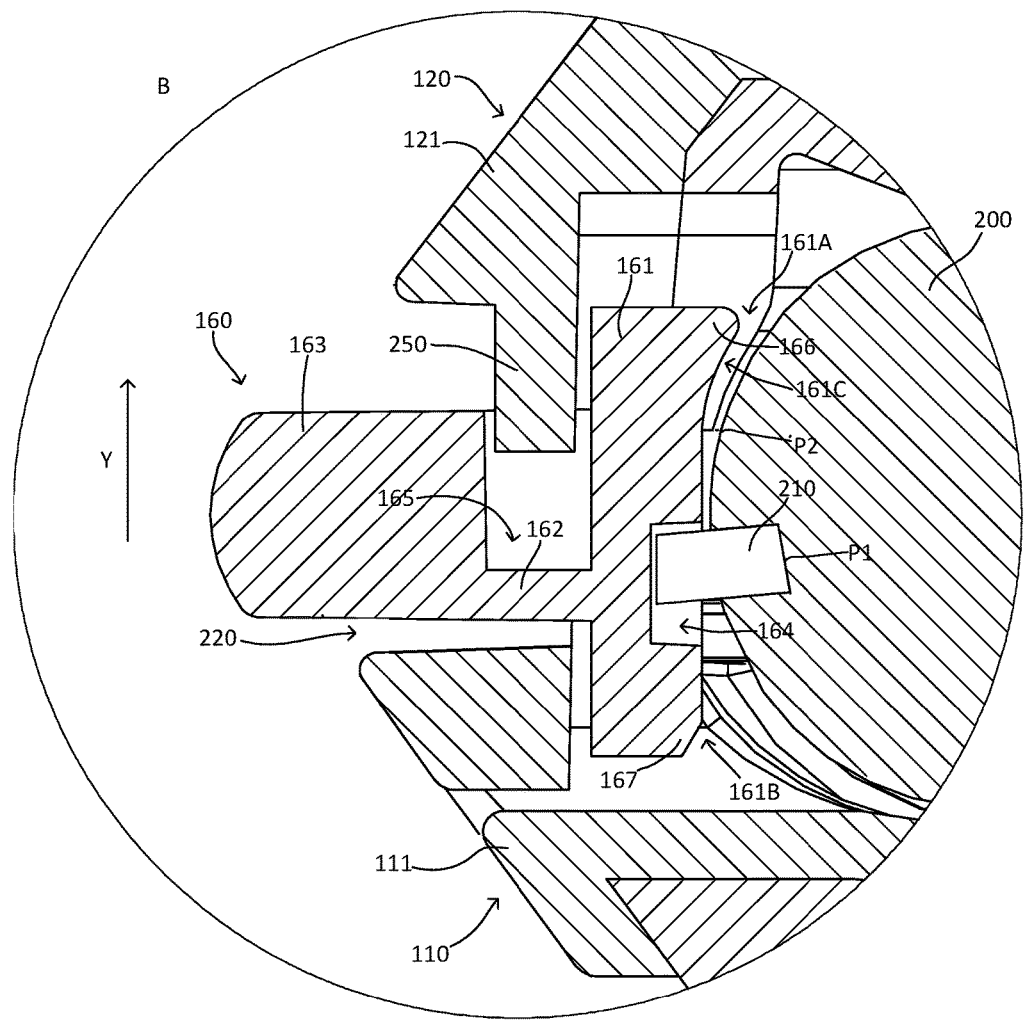
FIG. 2C is an enlarged view of section B shown in FIG. 2A of a cross-section of a protective case according to various embodiments.
Figure 3A:
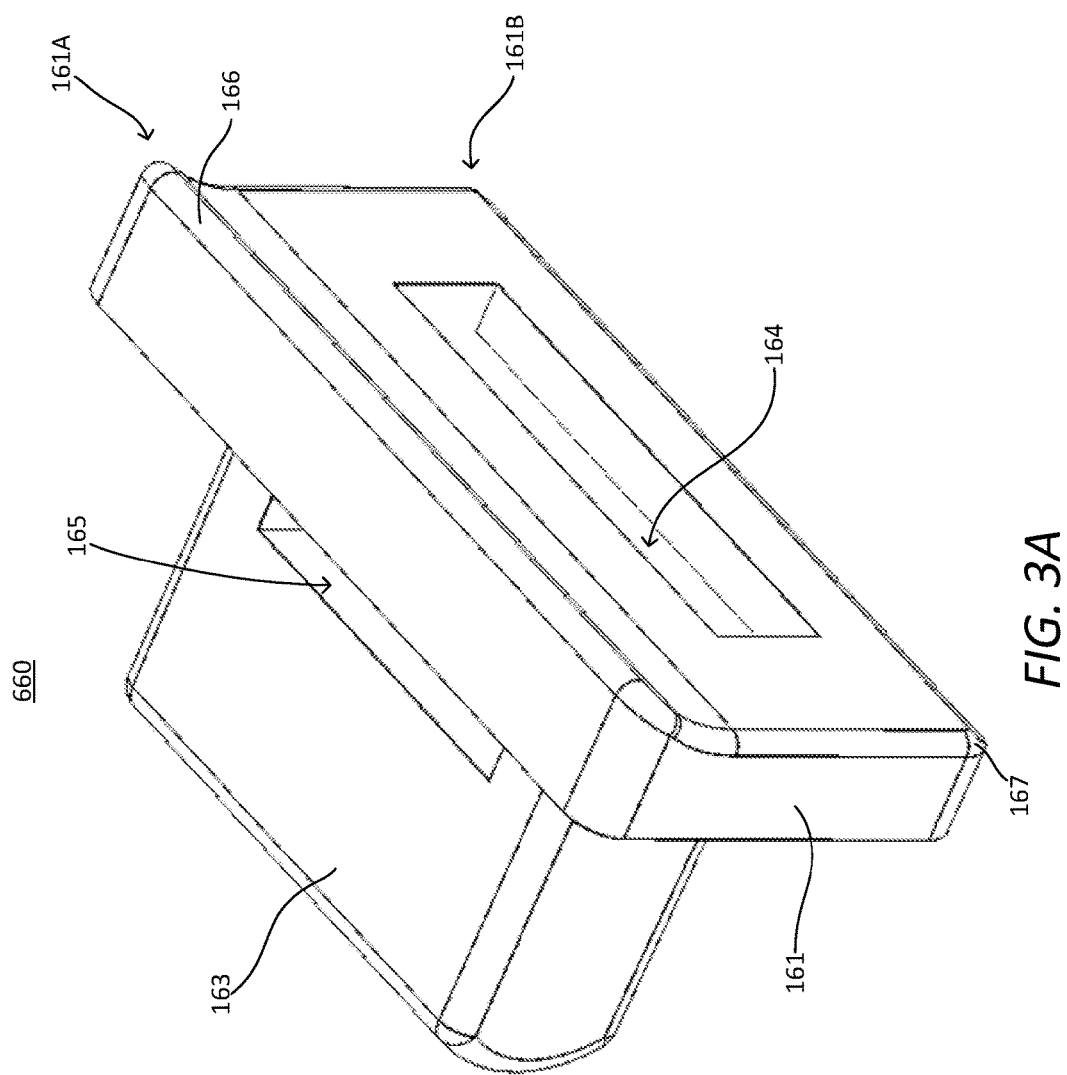
FIG. 3A is a perspective view of a control feature of a protective case according to various embodiments.

FIG. 2A is a cross-section view of section A shown in FIG. 1F of the protective case 100 according to various embodiments. FIG. 2B is an enlarged view of section B shown in FIG. 2A of a cross-section of the protective case 100 according to various embodiments. FIG. 2C is an enlarged view of section B shown in FIG. 2A of a cross-section of the protective case 100 according to various embodiments. FIG. 3A is a perspective view of the control feature 160 of the protective case 100 according to various embodiments. FIG. 3B is a side view of the control feature 160 of the protective case 100 according to various embodiments. FIG. 3C is a front view of the control feature 160 of the protective case 100 according to various embodiments. FIG. 3D is a top view of the control feature 160 of the protective case 100 according to various embodiments. FIG. 3E is a cross-section view of section C shown in FIG. 3D of the control feature 160 of the protective case 100 according to various embodiments.

In some embodiments, the electronic device 200 is housed within the protective case 100 (e.g., when the rear cover 110 and the front cover 120 are coupled together to encase the electronic device 200. In some embodiments, the electronic device 200 includes an AV switch 210. In some embodiments, the control feature 160 is configured for linear movement relative to a linear dimension (e.g., height dimension) of the electronic device 200 (e.g., a dimension extending in a direction from the rear cover 110 to the front cover 120 and vice versa). In other embodiments, the control feature 160 is configured to pivot about an axis to interact with the AV switch 210 of the electronic device 200.

In various embodiments, the AV switch 210 may be configured for movement in a first direction X (e.g., toward a rear surface of the electronic device 200 adjacent the rear cover 110) to a first position P1, which provides a first state (e.g., "OFF"), and a second direction Y (e.g., toward a front surface of the electronic device 200 adjacent the front cover 120) opposite the first direction X to a second position P2, which provides a second state (e.g., "ON").

In various embodiments, the control feature 160 is configured to actuate the AV switch 210 (at least) between the first position P1 and the second position P2, and vice versa. In some embodiments, the control feature 160 is formed with the front outer body 121. In other embodiments, the control feature 160 is formed with the rear outer body 111. For example, the control feature 160 and the front outer body 121 (or rear outer body 111) may be formed by being overmolded together. In some embodiments, the control feature 160 snap fits or pushes into an opening in the front outer body 121 (or the rear outer body 111). In some embodiments, the control feature 160 is formed separately from the remainder of the protective case 100 and later affixed in an opening at the protective case (e.g., an opening in the rear outer body 111 or the front outer body 121). In other embodiments, the control feature 160 is formed with the protective case 100 as one piece.

In some embodiments, the control feature 160 is formed by injection molding. In some embodiments, the control feature 160 is formed of any suitable material for engaging with the AV switch 210, such as, but not limited to, nylon, acrylonitrile butadiene styrene (ABS), and/or the like. Thus, the control feature 160 may be slidably movable relative to the front cover 120 (or other suitable portion of the protective case 100) along an axis that is parallel to the dimension along which the AV switch 210 moves. In other embodiments, the control feature 160 pivots or rotates along an axis that is orthogonal to the dimension along which the AV switch 210 moves (e.g., a rocking switch), for actuating the AV switch 210.

In some embodiments, the control feature 160 includes a first body portion 161, a central body portion 162, and a second body portion 163 extending from the first body portion 161. In some embodiments, the first body portion 161 is located in the protective case 100 when the front cover 120 is coupled with the rear cover 110, while a portion of the second body portion 163 is located outside of the protective case 100. In some embodiments, the central body portion 162 is part of the second body portion 163 and is located at an opening or hole 220 in the front outer body 121.

In other embodiments, the control feature 160 is located in the rear outer body 111 such that the central body portion 162 penetrates through an opening in the rear outer body 111.

In some embodiments, the first body portion 161, the central body portion 162, and the second body portion 163 are made as a unitary structure. In other embodiments, each of the first body portion 161, the central body portion 162, and the second body portion 163 are made individually and later formed or attached together to form the control feature 160, such that the control feature 160 is formed of multiple parts or portions.

In some embodiments, the first body portion 161 includes a chamber 164 and is arranged inside of the protective case 100 so as to be adjacent the AV switch 210. The chamber 164 may have dimensions (e.g., depth, width, and height) large enough to accommodate some or all of the AV switch 210 therein. The chamber 164 has a volume configured to receive the AV switch 210, when the electronic device 200 is located within the protective case 100. In particular embodiments, the chamber 164 at least partially (or fully) surrounds or encompasses an extended portion of the AV switch 210, when the electronic device 200 is located within the protective case 100. In other embodiments, instead of a chamber 164, the first body portion 161 includes a plurality of protrusions or prongs or a shaped surface corresponding to the shape of the AV switch 210 configured to straddle or encompass the AV switch 210 for actuating the AV switch 210 in different directions.

When the AV switch 210 is located within the chamber 164, movement of the control feature 160 may cause the interior or side walls of the chamber 164 to push or otherwise move the AV switch 210 in a corresponding direction. In some embodiments, the AV switch 210 fits in the chamber 164 such that the AV switch 210 occupies substantially all of the space or volume in the chamber 164. The chamber 164 may be configured to receive the AV switch 210 and shift the AV switch 210 between the first position P1 and the second position P2 when the control feature 160 is actuated or moved by a user in the directions X and Y. For example, when the switch 210 is received in the chamber 164 and the control feature 160 is moved in the second direction Y, the AV switch 210 is moved from the first position P1 to the second position P2. Similarly, when the switch 210 is received in the chamber 164 and the control feature 160 is moved in the first direction X, the AV switch 210 is moved from the second position P2 to the first position P1.

In some embodiments, the control feature 160 is configured to be movable in the first direction X (at least) until the AV switch 210 reaches the first position P1, at which the AV switch 210 is in the first state (e.g., "OFF"). In further embodiments, the control feature 160 is configured to be movable in the second direction Y (at least) until the AV switch 210 reaches the second position P2, at which the AV switch 210 is in the second state (e.g., "ON").

In some embodiments, the first body portion 161 includes a first end 161A and a second end 161B opposite the first end 161A. The first end 161A may be located adjacent the front cover 120 and the second end 161B may be located adjacent the rear cover 110. In some embodiments, at the first end 161A, the first body portion 161 includes a protrusion, such as a protruding lip 166. The lip 166 may be a portion of the first body portion 161 that extends outward towards the electronic device 200 when the electronic device 200 is housed within the protective case 100. Due to the protruding structure of the lip 166, the surface of the first body portion 161 that is adjacent the electronic device 200 includes a concave curvature 161C at the first end 161A. In some embodiments, the concave curvature 161C is designed to substantially align with or match the degree of convex curvature of a perimeter of the electronic device 200 to be housed within the protective case 100. In other embodiments (e.g., in which the control feature 160 is located through an opening in the outer body 111 of the rear cover 110), the first end 161A of the first body portion 161 is located adjacent the rear cover 110 and the second end 161B is located adjacent the front cover 120.

Accordingly, by substantially matching the concave curvature 161C of the first end 161A defined by the lip 166 with the convex curvature of the electronic device 200, the control feature 160 may readily align with the AV switch 210 such that the chamber 164 can more easily and readily receive the AV switch 210, when the electronic device 200 is placed in the protective case 100. Furthermore, the curvature 161C defined by the lip 166 can help in constraining the control feature 160 from traveling beyond the limited path of the AV switch 210, when the control feature 160 is moved in the first direction X.

In some embodiments, the second end 161B of the first body portion 161 includes a recessed or an angled edge 167. The angled edge 167 may be angled or curved away from the location of an encased electronic device 200, such that the second end 161B is recessed from the encased electronic device 200. Accordingly, in some embodiments, the angled edge 167 at the second end 161B may be configured to minimize contact between the control feature 160 and an encased electronic device 200, to minimize scratching or abrasions of the encased electronic device 200.

In some embodiments, the control feature 160 further includes a channel 165 within the central body portion 162 (located between the first body portion 161 and the second body portion 163). The channel 165 is configured to receive at least a portion of a protrusion extending from one of the covers 110 or 120 (such as the downward extending protrusion 250, extending from the front cover 120, as shown in FIG. 2C). In some embodiments, the channel 165 does not extend all the way through the central body portion 162.

The protrusion 250 may extend from the front cover 120 towards the rear cover 110 when the front cover 120 and the rear cover 110 are coupled together. The protrusion 250 and the channel 165 may be configured such that the protrusion 250 extends at least partially into the channel 165 of the control feature 160. As such, the control feature 160 may be configured to slide upwards in the first direction X or downwards in the second direction Y along the protrusion 250. The protrusion 250 may be configured to guide the control feature 160 with respect to the direction, path, and distance that the control feature 160 travels, and inhibit the control feature 160 from passing completely through the opening 220 in the front outer body 121 of the front cover 120. In some embodiments, the AV switch 210 extends transverse to (for example, substantially perpendicular to) the direction in which the protrusion 250 extends and the first and second directions X and Y. Accordingly, a depth of the chamber 164 (e.g., the horizontal dimension of the chamber 164 in FIG. 2B and FIG. 2C) may extend transverse to (for example, substantially perpendicular to) a direction that a depth of the channel 165 extends (e.g., the vertical dimension of the channel 165 in FIG. 2B and FIG. 2C).

In some embodiments, when the control feature 160 is positioned in the first position P1, a relatively small length of the protrusion 250 extends into the volume or space of the channel 165, for example, a length sufficient to retain the control feature 160 and inhibit the control feature 160 from passing through the opening 220 and falling off of the front cover 120, for example, when the electronic device 200 is not present. In other embodiments, when the control feature 160 is positioned in the first position P1, the protrusion 250 may not occupy any of the volume or space within the channel 165.

In some embodiments, when the control feature 160 is positioned in the second position P2, the volume or space of the channel 165 is substantially fully occupied by the protrusion 250. In such embodiments, the depth of the channel 165 may be selected such that the bottom surface of the channel provides a stop against which the protrusion 250 abuts when the control feature is in the second position P2, to control the maximum amount of movement of the control feature 160 in the second direction Y. In other embodiments, a portion of the protrusion 250 occupies a portion, but not all of the volume within the channel 165, and another portion of the protrusion 250 remains outside of the channel 165, when the control feature 160 is positioned in the second position P2.

In some embodiments, the central body portion 162 of the control feature 160 extends from the first body portion 161 located inside of the protective case 100, through the perimeter of the protective case 100 (e.g., through the outer body 121), and to the second body portion 163 located outside of the perimeter of the protective case 100. Accordingly, a user may actuate the control feature 160 (e.g., by manually moving the control feature 160 in the first direction X or in the second direction Y with a finger or other implement) via the outward extending end of the second body portion 163 (the end that faces away from the electronic device 200 encased in the protective case 100).

In particular embodiments, the outward extending end of the second body portion 163 does not extend beyond the outer edge of the outer body 121 but, instead, is located within a recess in the outer body 121 or is flush with the outer surface of the outer body 121. In one embodiment, the outer body 121 is a single layer that extends in a rectangular perimeter and provides cushioning to the encased electronic device 200, while also sealing the openings corresponding to switches and buttons of the device. In other embodiments, the outer body 121 includes a plurality of discrete pieces melded together to form the perimeter wall of the protective case 100 (e.g., a top portion of the perimeter wall may be separately formed from a side portion of the perimeter wall).

In other embodiments, instead of shifting linearly, the control feature 160 is configured to be pivotally supported in the protective case 100 and to pivot about an axis that is orthogonal to the dimension along which the AV switch 210 shifts. In such embodiments, the control feature 160 is configured such that the chamber 164 causes the AV switch 210 to move in the second direction Y from the first state (e.g., "OFF", P1) to the second state (e.g., "ON", P2) when the control feature 160 is pivoted or rotated in an upward direction (e.g., rotated in a direction from P1 to P2). In addition, the control feature 160 may be configured such that the chamber 164 causes the AV switch 210 to move in the first direction X from the second state ("P2") to the first state ("P1") when the control feature 160 is pivoted or rotated in a downward direction (e.g., rotated in a direction from P2 to P1).

In yet further embodiments, the control feature 160 includes an indicator for indicating a position of the control feature 160, for example, relative to the first position P1 and the second position P2. In some embodiments, one or more markers or indicators may be provided on the front cover 120 to indicate the location of the first position P1 and/or the second position P2. Accordingly, a user can readily determine the state of the AV switch 210 based on the indicators on the first cover 120. Although various embodiments relate to a control feature for actuating the AV switch 210, in other embodiments, any one or more of the other features of the protective case 100 may be a switch for actuating a corresponding operator of the electronic device 200.

In further embodiments, the control feature 160 includes a stop member for preventing continued movement of the control feature 160 in the first direction X and/or the second direction Y. For example, the central body portion 162 may be configured to contact stop surfaces in the front cover 120 at locations in or adjacent the opening 220. Accordingly, when the control feature 160 is completely actuated in the X direction, a bottom surface of the central body portion 162 (e.g., a surface facing the rear cover 110) may contact a stop surface of the front cover 120 that is located in or adjacent a bottom portion of the opening 220. Likewise, when the control feature 160 is completely actuated in the Y direction, a top surface of the central body portion 162 (e.g., a surface facing the front cover 120) may contact a stop surface of the front cover 120 that is located in or adjacent a top portion of the opening 220.

Figure 4A:
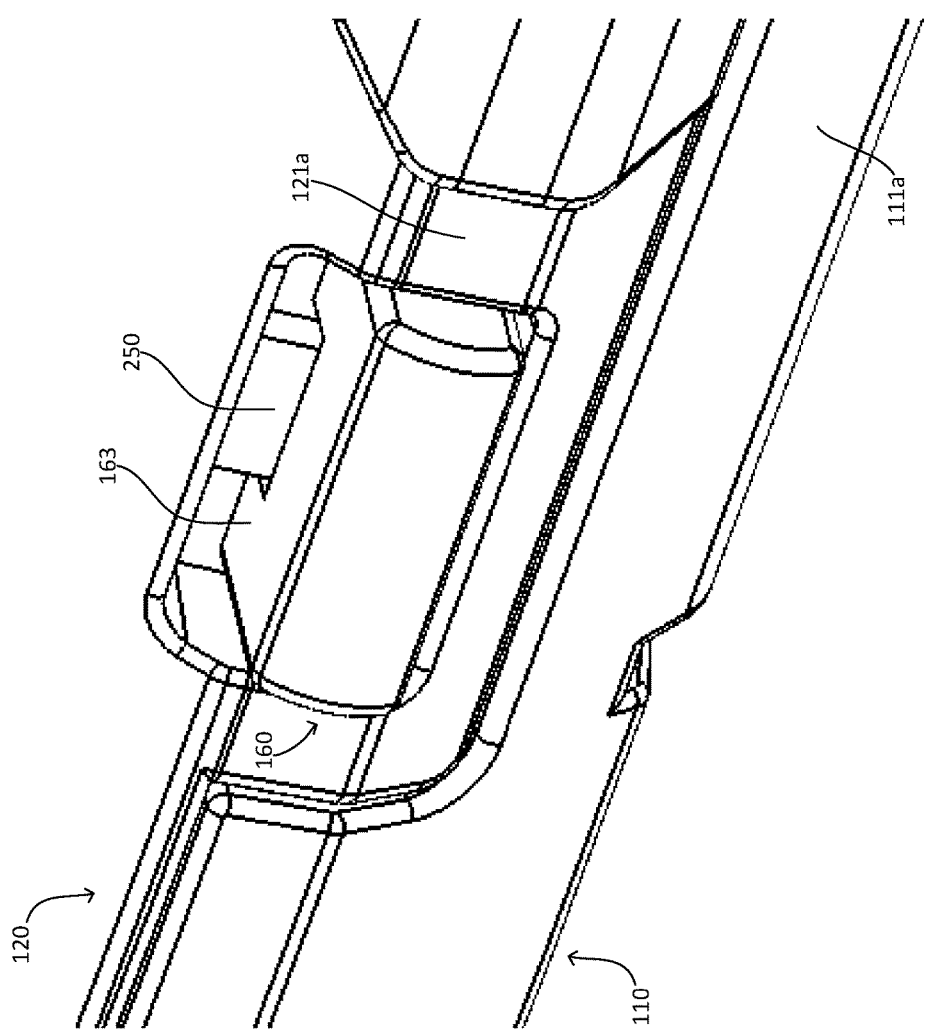
FIG. 4A is an enlarged perspective view of an outer portion of a protective case according to various embodiments.
Figure 4B:
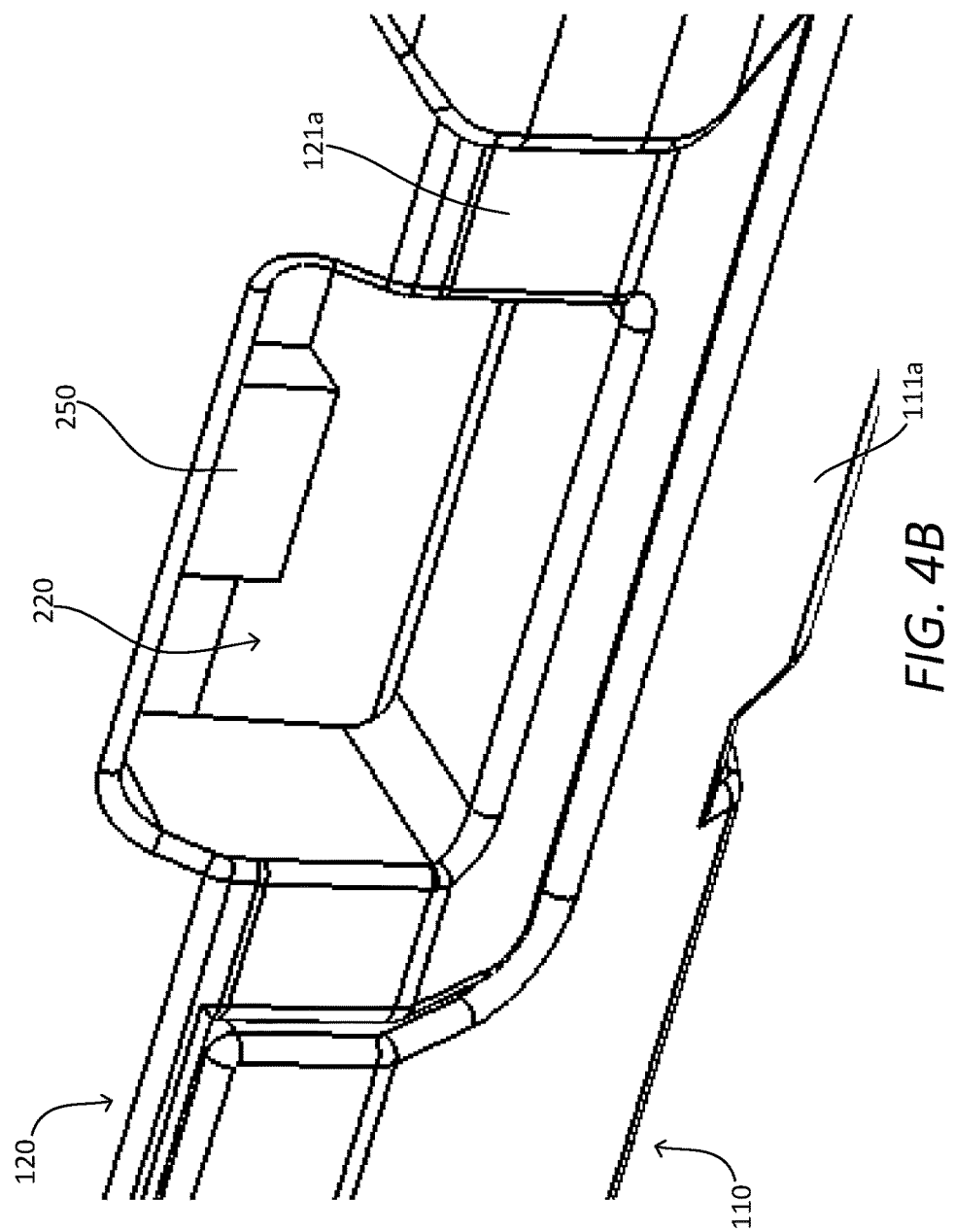
FIG. 4B is an enlarged perspective view of an outer portion of a protective case without a control feature according to various embodiments.
Figure 4C:
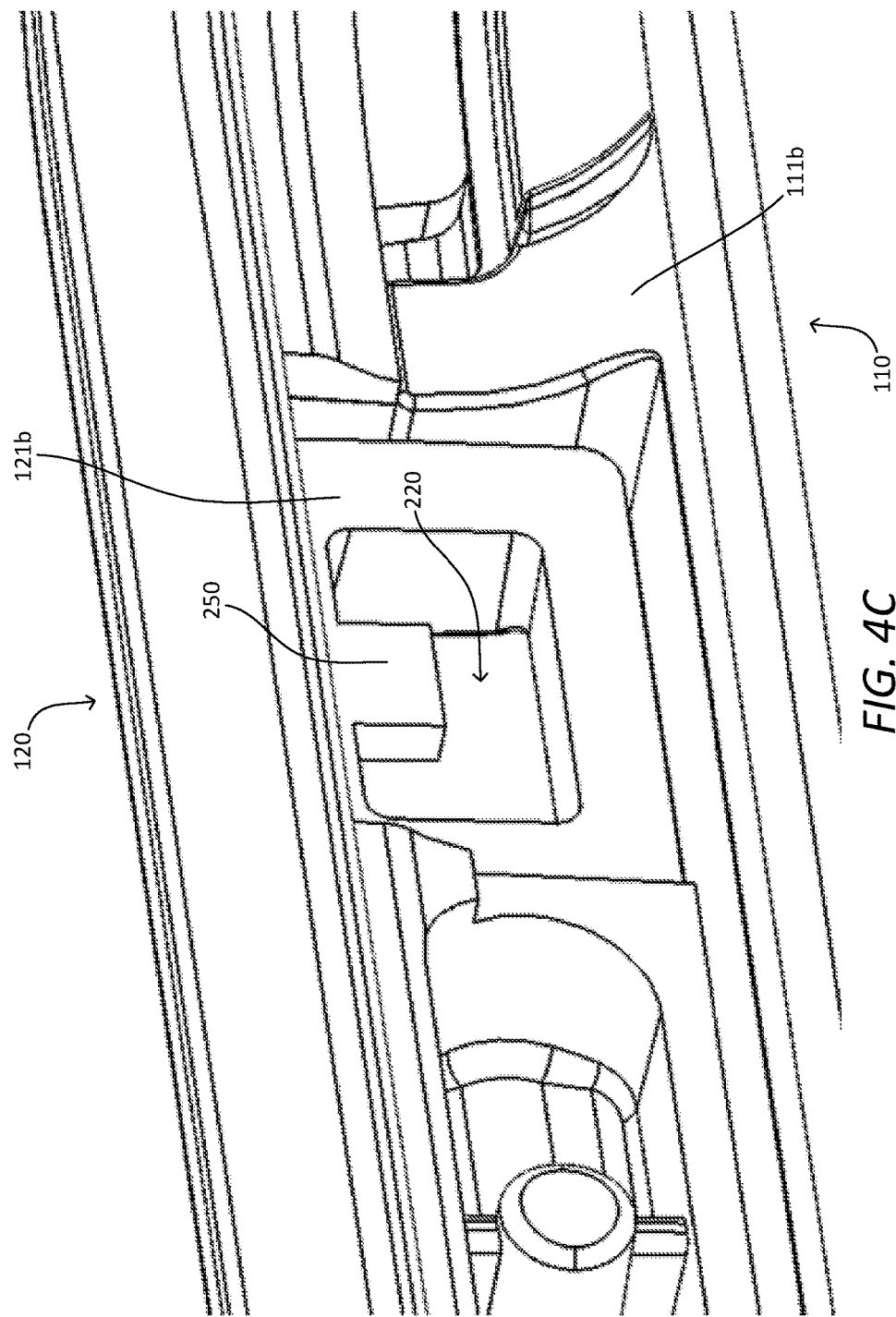
FIG. 4C is an enlarged perspective view of an inner portion of a protective case without a control feature according to various embodiments.

FIG. 4A is an enlarged perspective view of an outer portion of the protective case 100 according to various embodiments. FIG. 4B is an enlarged perspective view of an outer portion of a protective case 100 without the control feature 160 according to various embodiments. FIG. 4C is an enlarged perspective view of an inner portion of the protective case 100 without the control feature 160 according to various embodiments.

Referring to FIGS. 4A-4C, in some embodiments, the protective case 100 includes the opening or hole 220 through a perimeter of the case 100. The hole 220 may be located at the front cover 120 through the outer body 121. In other embodiments, the hole 220 is located at the rear cover 110 through the outer body 111. In some embodiments, the control feature 160 is positioned in and through the hole 220 so that the first body portion 161 is located within the protective case 100 and the second body portion extends through the hole 220 from the first body portion 161 to the outside of the protective case 100. In particular embodiments, the control feature 160 is arranged in the hole 220 such that the channel 165 is aligned with the protrusion 250.

Figure 5:
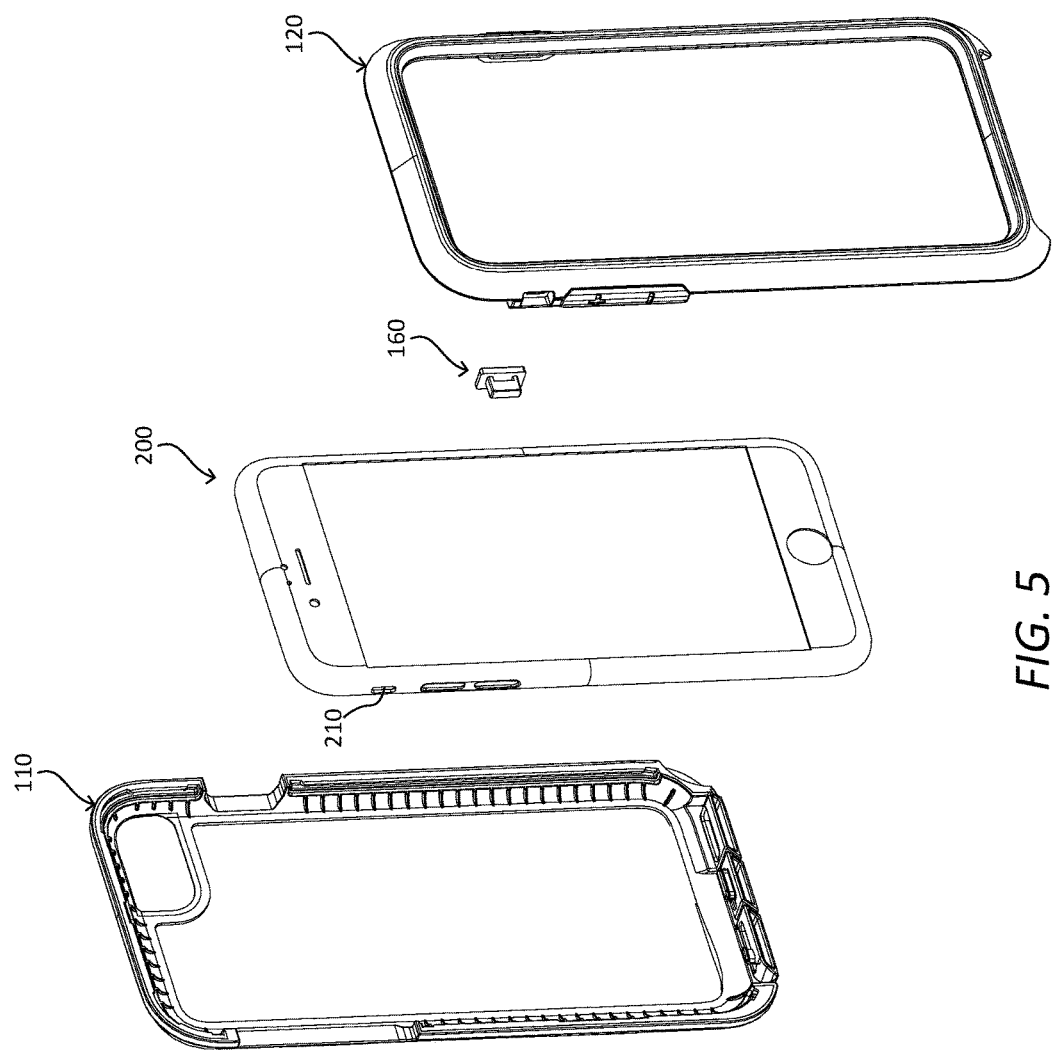
FIG. 5 is an exploded view of a protective case according to various embodiments.

FIG. 5 is an exploded view of the protective case 100 according to various embodiments.

Referring to FIG. 5, in some embodiments, the electronic device 200 is housed between the rear cover 110, which is configured to receive a rear surface of the electronic device 200, and the front cover 120, which is configured to receive a front surface of the electronic device 200. In some embodiments, the front cover 120 includes an opening corresponding to an interactive display of the electronic device 200 such that a user may contact and interact with the display while the electronic device 200 is encased within the protective case 100, through that opening. In some embodiments, the opening in the front cover 120 corresponding to the interactive display of the electronic device 200 includes a transparent or partially transparent membrane for protection of the interactive display (e.g., a removably attached or permanently attached membrane). In such embodiments, the membrane may be configured to allow interaction with a touch screen interface on the electronic device 200, when the electronic device is housed within the protective case 100.

In some embodiments, the control feature 160 may be a separate component from the rear cover 110 and the front cover 120. In other embodiments, the control feature 160 is manufactured (e.g., molded) together with one of the rear cover 110 or the front cover 120.

Figure 6A:
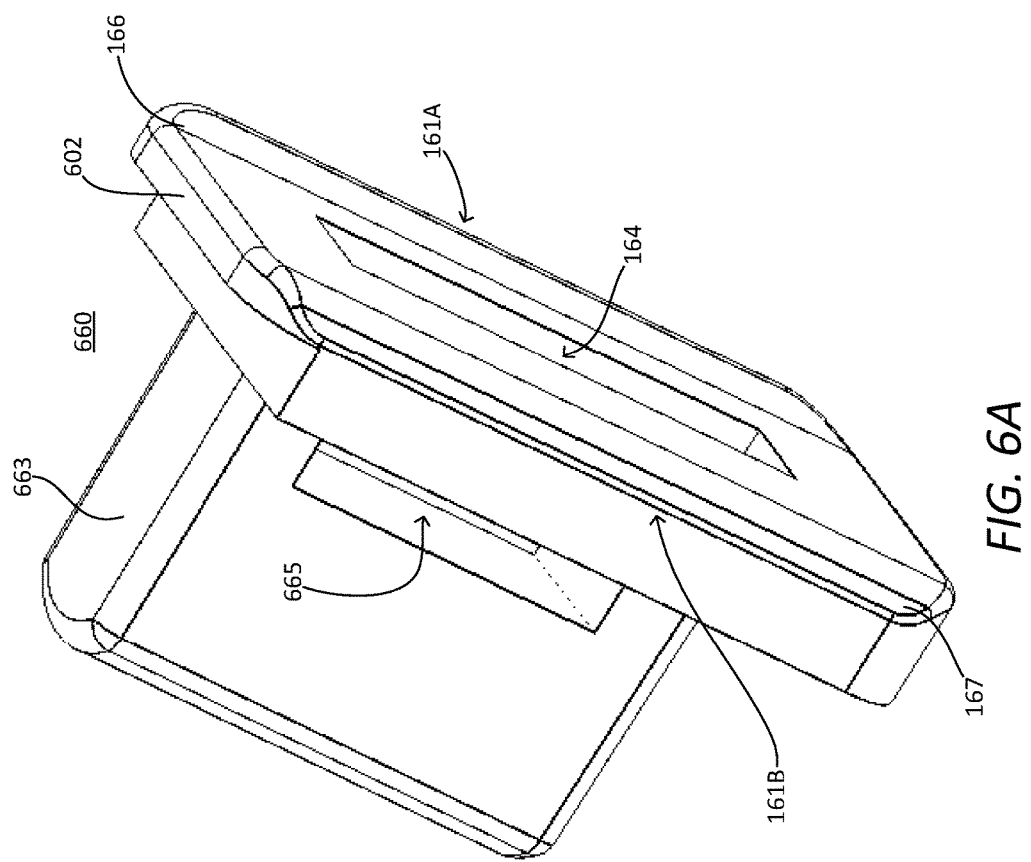
FIG. 6A is a bottom perspective view of a control feature of a protective case according to various embodiments.
Figure 6B:
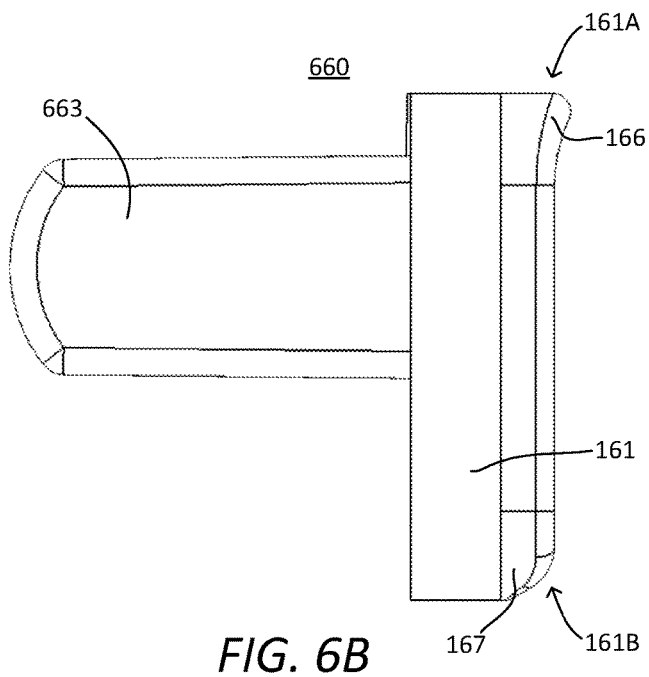
FIG. 6B is a side view of a control feature of a protective case according to various embodiments.
Figure 6C:
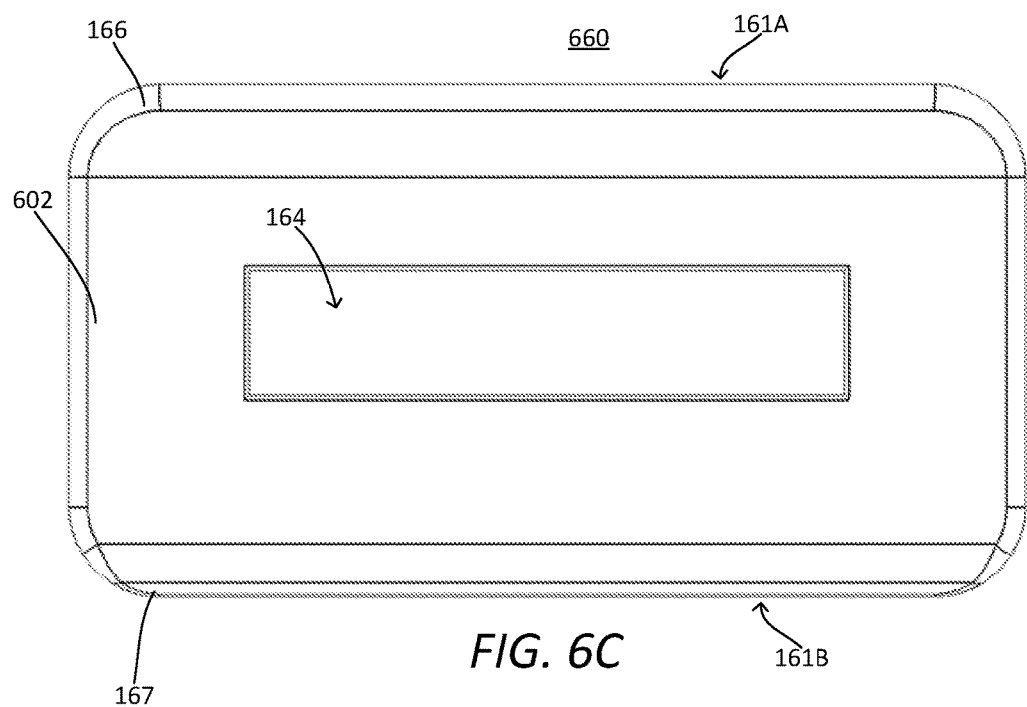
FIG. 6C is a front view of a control feature of a protective case according to various embodiments.
Figure 6E:
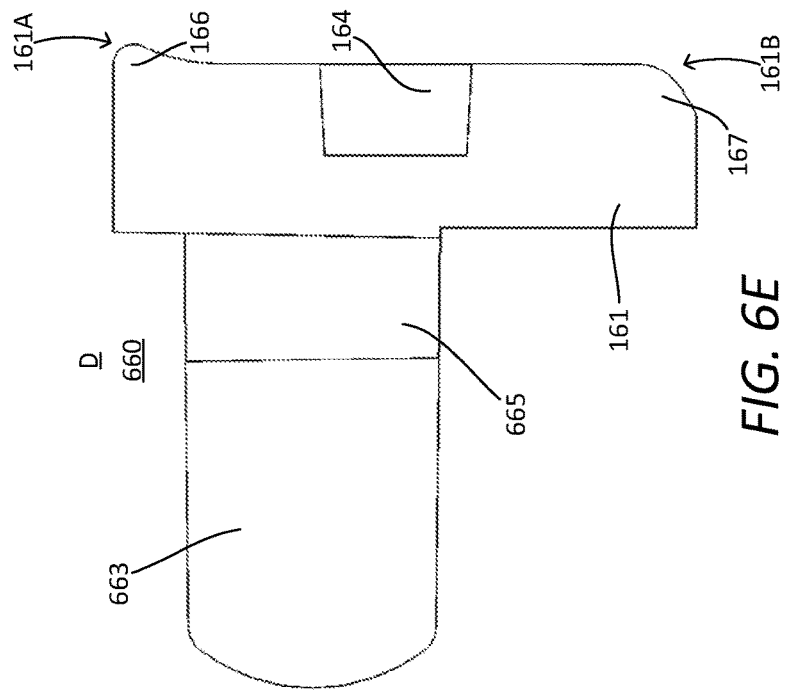
FIG. 6E is a cross-section view of section D shown in FIG. 6D of a control feature of a protective case according to various embodiments.
Figure 6D:
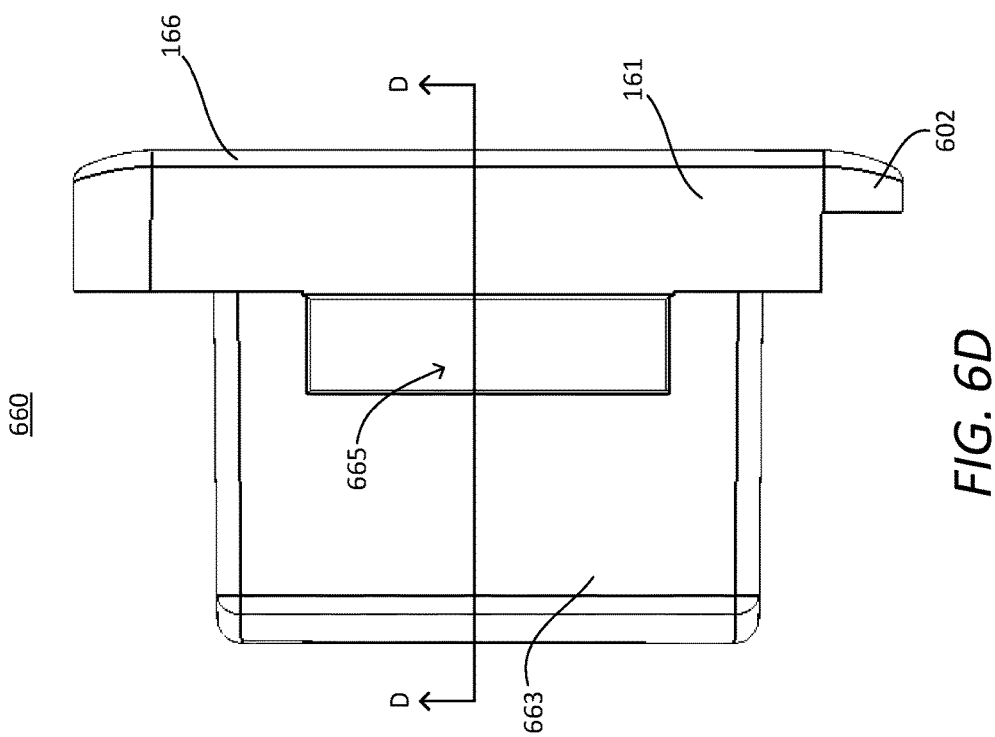
FIG. 6D is a top view of a control feature of a protective case according to various embodiments.
Figure 6G:
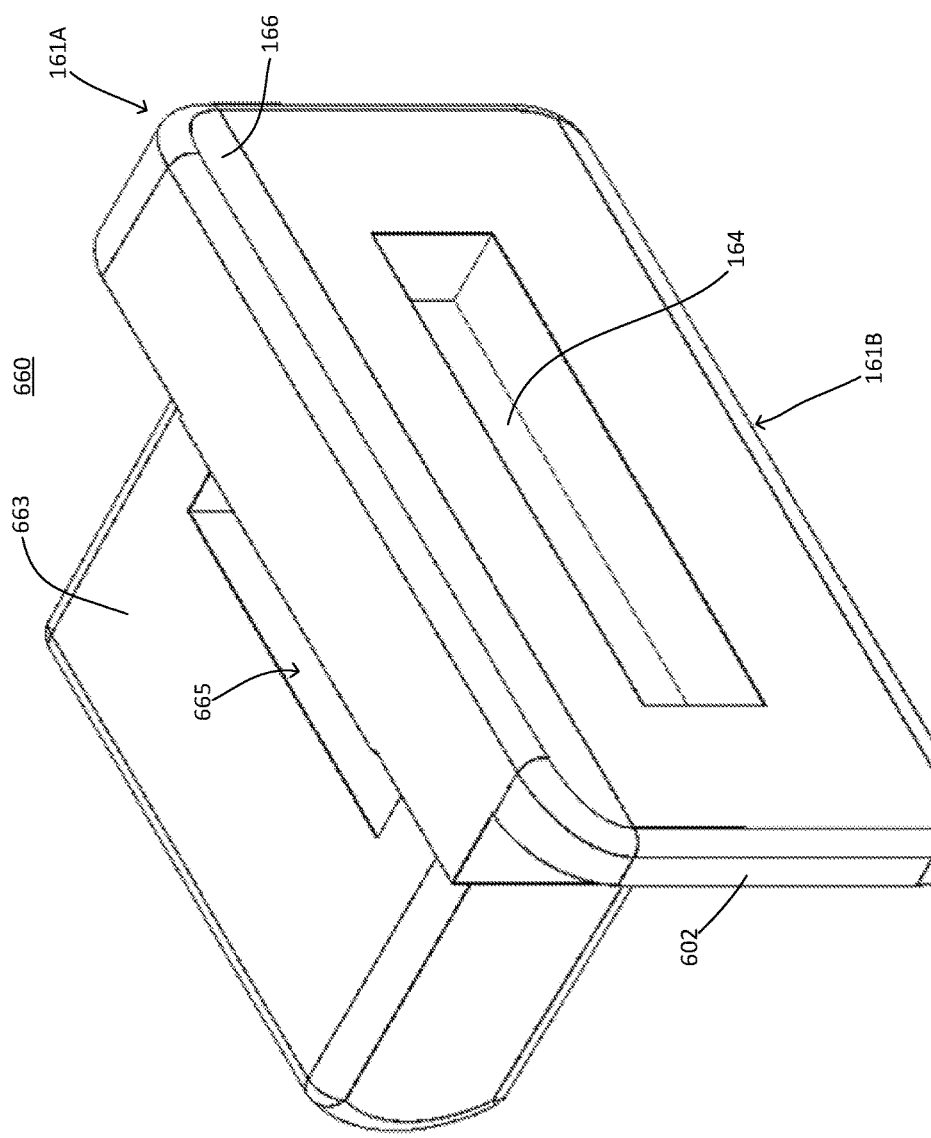
FIG. 6G is a front perspective view of a control feature of a protective case according to various embodiments.
Figure 7:
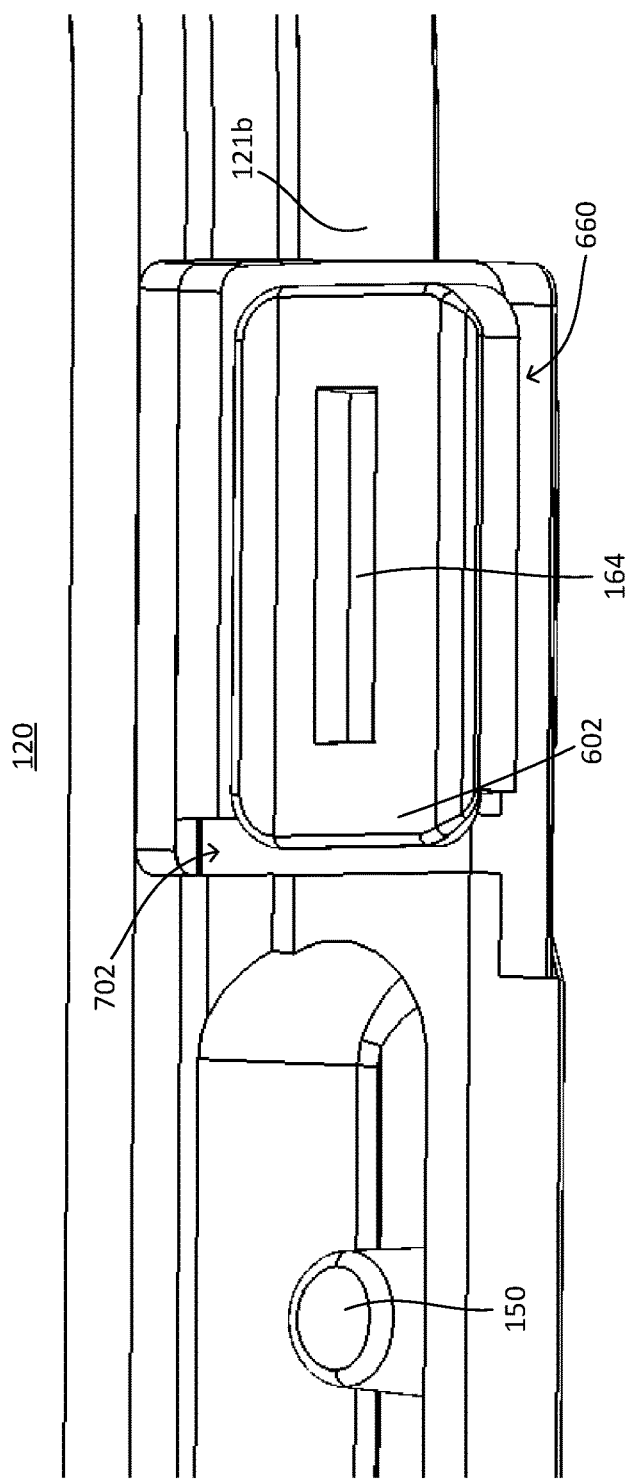
FIG. 7 is an enlarged perspective view of an inner portion of a protective case including a control feature according to various embodiments.
Figure 8:
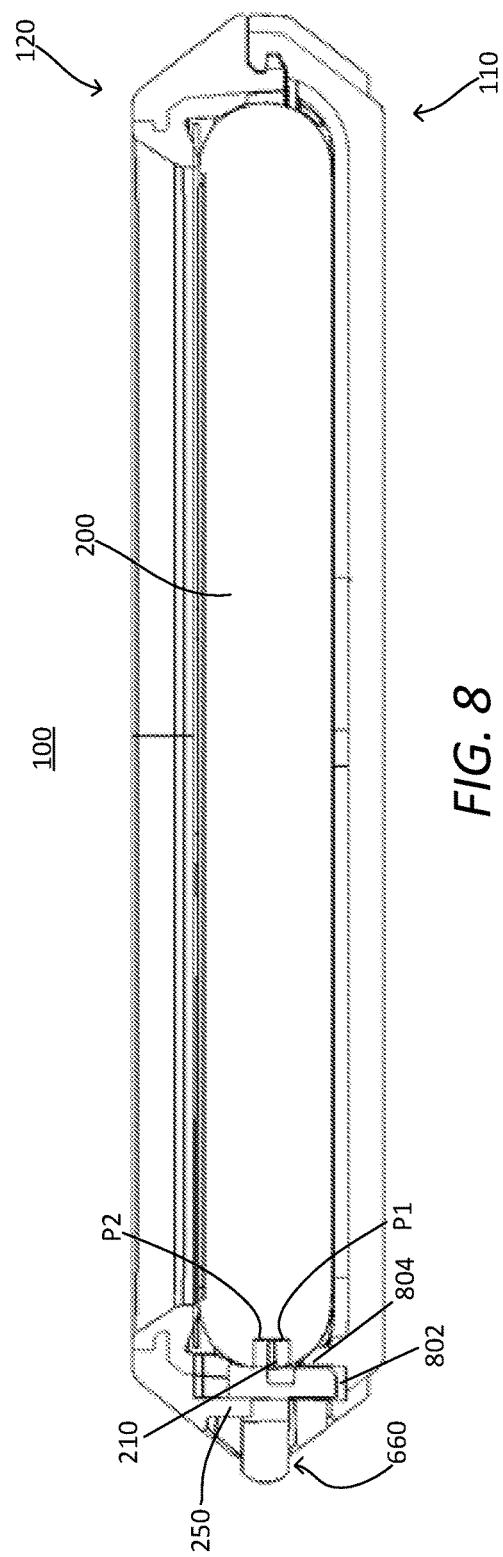
FIG. 8 is a cross-section view at a control feature of a protective case according to various embodiments.

FIG. 6A is a bottom perspective view of a control feature 660 of the protective case 100 according to various embodiments. FIG. 6B is a side view of the control feature 660 of the protective case 100 according to various embodiments. FIG. 6C is a front view of the control feature 660 of the protective case 100 according to various embodiments. FIG. 6D is a top view of the control feature 660 of the protective case 100 according to various embodiments. FIG. 6E is a cross-section view of section D shown in FIG. 6D of the control feature 660 of the protective case 100 according to various embodiments. FIG. 6F is a rear perspective view of the control feature 660 of the protective case 100 according to various embodiments. FIG. 6G is a front perspective view of the control feature 660 of the protective case 100 according to various embodiments. FIG. 7 is an enlarged perspective view of an inner portion of the protective case 100 including the control feature 660 according to various embodiments. FIG. 8 is a cross-section view at the control feature 660 of the protective case 100 according to various embodiments.

According to various embodiments, the control feature 660 is incorporated into a protective case (e.g., into the protective case 100). Features and descriptions relating to the control feature 160 apply to the control feature 660, unless inconsistent with the further description of control feature 660 herein. In some embodiments, the control feature 660 includes an extension or wing 602 extending from a side of the first body portion 161. In various embodiments, the wing 602 serves to ensure that the control feature 660 is installed correctly during manufacturing of the protective case 100. For example, the inner peripheral wall 121b of the front cover 120 of the protective case 100 may include a recess 702 for receiving the wing 602 such that the control feature 660 fits onto the case 100 and operates correctly when the wing 602 is received in the recess 702. In some embodiments, the recess 702 is at a location at the inner peripheral wall 121b of the front cover 120, adjacent the hole 220 and at only one side of the hole 220. In particular embodiments, the recess 702 is located adjacent the first button plunger 150. In some embodiments, the portion of the inner peripheral wall 121b across the hole 220 from the side at which the recess 702 is located, does not include a recess.

Accordingly, in some embodiments, if the control feature 660 is aligned with the hole 220 incorrectly (upside down) during manufacturing, the wing 602 would fail to align with the recess 702 in the protective case 100, such that the control feature could not be properly installed or assembled onto the front cover 120, or such that the improper alignment would be readily recognized during the manufacturing process, or both. In a particular example, if the control feature 660 were to be installed upside down, the wing 602 and the recess 702 would be located at opposite sides of the hole 220 (e.g., the recess 702 being located at or adjacent a first side of the hole 220 adjacent to or towards the first and second button plungers 150 and 155, and the wing 602 being located at or adjacent a second side of the hole 220).

In some embodiments, the wing 602 is located at a lateral edge of the first body portion 161. For example, the wing 602 may extend from the lateral edge in a direction that is parallel to the perimeter of the outer body 111, 121. In particular embodiments, the wing 602 extends in a direction towards the first and second button plungers 150, 155 when the control feature 660 is properly installed in the protective case 100. In some embodiments, the wing 602 is manufactured as a separate component from the first body portion 161 (or from the control feature 660). In other embodiments, the control feature 660 is formed as a single, unitary structure, including the first body portion 161 and the wing 602.

In some embodiments, the wing 602 is a protrusion extending from the first body portion 161 and having a height (e.g., in a dimension extending in a direction from the rear cover 110 to the front cover 120) substantially similar to that of the first body portion 161. In other embodiments, the wing 602 is any suitable structure for ensuring the control feature 660 is properly installed in the protective case 100. For example, the wing 602 may be a projection having a shape different from the shape shown in the drawings (e.g., a shape of a rod, a pin, an angular protrusion, and/or the like) extending from the control feature 660 for aligning with a corresponding recess (e.g., a recess shaped to receive the projection) at the inner peripheral wall 121b of the protective case 100 adjacent the hole 220. In other embodiments, a recess is located at the control feature 660 while a protrusion (e.g. the wing 602) extends from the inner peripheral wall 121b into the recess at the control feature 660. For example, instead of a recess 702, the protective case 100 may include a wing at the location of the recess 702, with the wing located at the recess 702 extending towards the control feature 660.

In some embodiments, the control feature 660 includes a second body portion 663 extending from the first body portion 161. The above disclosure corresponding to the second body portion 163 may be applicable to the second body portion 663. In some embodiments, the second body portion 663 includes a channel 665 through the second body portion 663. The description and features of the channel 165 apply to the channel 665, unless inconsistent with the description of the channel 665 herein. In some embodiments, the channel 665 extends completely through the second body portion 663. The channel 665 may be configured to receive the protrusion 250 extending from the front cover 120. Accordingly, in some embodiments, because the channel 665 extends completely through the second body portion 161, various phones (e.g., various different models) having different AV switch travel distances can be accommodated by the control feature 660 as the channel 665 travels along the protrusion 250.

In some embodiments, the second body portion 663 is located at an off-center position along the height of the first body portion 161 (e.g., in a dimension extending from the rear cover 110 to the front cover 120). In particular embodiments, the second body portion 663 is located closer to the front cover 120 than to the rear cover 110, along the height dimension of the first body portion 161, when the control feature 660 is installed in the protective case 100. Accordingly, in some embodiments, the control feature 660 (e.g., the first body portion 161) includes a shorter segment of the first body portion 161 above the location where the second body portion 663 and central body portion extend from the first body portion 161, and includes a longer segment of the first body portion 161 below the location where the second body portion 663 and the central body portion extend from the first body portion 161 (with reference to the orientation shown in FIG. 6B).

In some embodiments, the rear cover 110 includes a trough 802 located in a portion of an extended inner wall 804 of the rear cover 110. In particular embodiments, the trough 802 is configured to receive at least a portion of the longer segment of the first body portion 161 during some or all of the motion of the control feature 660. Accordingly, the trough 802 may help guide travel of the control feature 660

(e.g., as the control feature 660 moves between the first position P1 and the second position P2). In particular embodiments, the longer segment of the first body portion 161 extends further into the trough 802 when the control feature 660 is at the first position P1 than when the control feature 660 is at the second position P2.

It is to be understood that although particular embodiments of the protective case 100 are for encasing an electronic device, the object to be housed in the protective case 100 may be any suitable object. In addition, it should be noted that the protective case 100 may have other, different suitable shapes, sizes, and configurations, as compared to those shown in the accompanying drawings. For instance, in some embodiments, the protective case 100 may include two separate members (e.g., separate individual rear and front covers 110, 120) that are configured for being removably coupled together to surround the electronic device and thereby enclose the electronic device. In other embodiments, the rear and front covers 110, 120 are not separate members, but rather are members that are joined, for instance, by a common hinge element, or a single member configured for being folded upon itself and thereby forming the housing. In some embodiments, the protective case is a one-piece case and the control feature is located in a peripheral wall of the one-piece case (e.g., the case includes a rear cover only and the control feature is located in the rear cover).

In some embodiments, the electronic device 200 is received in the rear cover 110 instead of the front cover 120. In particular embodiments, a membrane is attached directly to the front cover 120 such that the membrane is positioned over a surface (e.g., an interactive display) of the electronic device 200. The electronic device 200, for example, may be received into a cavity defined by the rear cover 110 to position the back surface of the electronic device 200 with the bottom surface of the rear cover 110.

The embodiments disclosed herein are to be considered in all respects as illustrative, and not restrictive of the invention. The present invention is in no way limited to the embodiments described above. Various modifications and changes may be made to the embodiments without departing from the spirit and scope of the invention. The scope of the invention is indicated by the attached claims, and their equivalents, rather than the embodiments. Various modifications and changes that come within the meaning and range of equivalency of the claims are intended to be within the scope of the invention.

What is claimed is:

1. A case for an electronic device, the case comprising:
a cover having a peripheral wall defining an interior for receiving at least a portion of the electronic device, the cover having a protrusion extending in a length dimension; and
a control feature extending through the peripheral wall of the cover, the control feature having:
a first body portion configured to engage a switch of the electronic device, when the electronic device is received in the interior of the cover;
a second body portion accessible from outside of the interior of the cover; and a central body portion between the first body portion and the second body portion, the central body portion having a channel in which the protrusion is received,
wherein the control feature is slideably moveable linearly along the length dimension of the protrusion, relative to the cover.

2. The case of claim 1, wherein the control feature extends through an opening in the peripheral wall of the cover and the protrusion extends at least partially into the opening.

3. The case of claim 2, wherein the protrusion extends into the channel a length sufficient to inhibit the control feature from separating from the cover, throughout a full range of motion of the control feature relative to the cover.

4. The case of claim 1, wherein the first body portion has a chamber having an interior volume for receiving a portion of the switch of the electronic device, when the electronic device is received in the interior of the cover.

5. The case of claim 4, wherein the channel in the central body portion has a depth dimension that extends in a direction transverse to a direction of a depth dimension of the chamber in the first body portion.

6. The case of claim 1, wherein the control feature including the first body portion, the second body portion, and the central body portion is formed as a single, unitary structure.

7. The case of claim 1, wherein the first body portion has a first end and a second end opposite the first end, the control feature further having a lip extending from the first end of the first body.

8. The case of claim 7, wherein the lip is configured to provide a concave curvature of the first body portion such that the curvature substantially conforms to a convex curvature of a body of the electronic device when the electronic device is housed in the case.

9. The case of claim 7, wherein the second end of the first body portion has an angled edge, the angled edge being angled away from the electronic device when the electronic device is housed in the protective case.

10. The case of claim 1, further comprising a second cover configured to couple with the cover having the peripheral wall for housing the electronic device between the second cover and the cover having the peripheral wall.

11. The case of claim 10, wherein the cover having the peripheral wall is a front cover configured to be positioned at an interactive display of the electronic device, and the control feature is located at the front cover.

12. The case of claim 10, wherein the second cover is a rear cover configured to be positioned at a rear surface of the electronic device, and the control feature is located at the rear cover.

13. The case of claim 1, wherein the control feature is configured to be positioned at a first position and at a second position different from the first position.

14. The case of claim 13, wherein the first position is below the second position along a height defined by a length of the protrusion.

15. A method of manufacturing a case for an electronic device, the method comprising:
providing a cover having a peripheral wall defining an interior for receiving at least a portion of the electronic device, the cover having a protrusion extending in a length dimension; and
providing a control feature extending through the peripheral wall of the cover, the control feature having:
a first body portion configured to engage a switch of the electronic device, when the electronic device is received in the interior of the cover;
a second body portion accessible from outside of the interior of the cover; and a central body portion between the first body portion and the second body portion, the central body portion having a channel in which the protrusion is received, wherein the control feature is slideably moveable linearly along the length dimension of the protrusion, relative to the cover.

16. The method of claim 15, wherein the control feature extends through an opening in the peripheral wall of the cover and the protrusion extends at least partially into the opening.

17. The method of claim 16, wherein the protrusion extends into the channel a length sufficient to inhibit the control feature from separating from the cover, throughout a full range of motion of the control feature relative to the cover.

18. The method of claim 15, wherein the first body portion has a chamber having an interior volume for receiving a portion of the switch of the electronic device, when the electronic device is received in the interior of the cover.

19. The method of claim 18, wherein the channel in the central body portion has a depth dimension that extends in a direction transverse to a direction of a depth dimension of the chamber in the first body portion.

20. A protective case configured to house an electronic device, the protective case comprising:
   a front cover having a peripheral wall defining an interior for receiving at least a portion of the electronic device, the front cover having a protrusion extending in a length dimension;
   a rear cover configured to couple with the front cover; and
   a control feature extending through the peripheral wall of the front cover, the control feature having:
      a first body portion configured to engage a switch of the electronic device, when the electronic device is received in the interior of the cover;
      a second body portion accessible from outside of the interior of the cover; and a central body portion between the first body portion and the second body portion, the central body portion having a channel in which the protrusion is received,
   wherein the control feature is slideably moveable linearly along the length dimension of the protrusion, relative to the cover.

* * * * *